US011783777B2

(12) United States Patent
Yang et al.

(10) Patent No.: US 11,783,777 B2
(45) Date of Patent: Oct. 10, 2023

(54) PIXEL CIRCUIT AND DRIVING METHOD THEREOF, DISPLAY SUBSTRATE AND DRIVING METHOD THEREOF, AND DISPLAY APPARATUS

(71) Applicant: BOE TECHNOLOGY GROUP CO., LTD., Beijing (CN)

(72) Inventors: Shengji Yang, Beijing (CN); Xiaochuan Chen, Beijing (CN); Hui Wang, Beijing (CN); Kuanta Huang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/916,671

(22) Filed: Jun. 30, 2020

(65) Prior Publication Data

US 2021/0056894 A1 Feb. 25, 2021

Related U.S. Application Data

(63) Continuation-in-part of application No. PCT/CN2019/102307, filed on Aug. 23, 2019.

(51) Int. Cl.
*G09G 3/325* (2016.01)
*G09G 3/3283* (2016.01)
(Continued)

(52) U.S. Cl.
CPC ........... *G09G 3/325* (2013.01); *G09G 3/3233* (2013.01); *G09G 3/3266* (2013.01); *G09G 3/3283* (2013.01); *G09G 2310/027* (2013.01)

(58) Field of Classification Search
CPC .... G09G 3/3233; G09G 3/3266; G09G 3/325; G09G 3/3283; G09G 2300/0861;
(Continued)

(56) References Cited

U.S. PATENT DOCUMENTS 5,898,322 A 4/1999 Kubota et al.
5,960,268 A 9/1999 Aihara
(Continued)

FOREIGN PATENT DOCUMENTS

CN 1530878 A 9/2004
CN 101833186 A 9/2010
(Continued)

OTHER PUBLICATIONS

Machine English Translation of CN 107103878, Sep. 23, 2021, 32 pages (Year: 2021).*
(Continued)

*Primary Examiner* — Jimmy H Nguyen
(74) *Attorney, Agent, or Firm* — Dilworth & Barrese, LLP.; Michael J. Musella, Esq.

(57) ABSTRACT

Disclosed are a pixel circuit and a driving method thereof, a display substrate and a driving method thereof, and a display apparatus. The pixel circuit includes a pixel sub-circuit, which includes: a driving circuit, including a control terminal, a first terminal and a second terminal; a voltage transmitting circuit, configured, in response to a transmission control signal, to apply a reset voltage and/or a first power voltage to the first terminal, respectively; and a data writing circuit, configured, in response to a scan signal, to write a data signal into the control terminal and store the data signal. The driving circuit is configured to control a voltage of the second terminal according to the data signal of the control terminal and the voltage of the first terminal, and to generate a driving current for driving a light-emitting element to emit light based on the voltage of the second terminal.

16 Claims, 10 Drawing Sheets

(51) Int. Cl.
*G09G 3/3266* (2016.01)
*G09G 3/3233* (2016.01)

(58) Field of Classification Search
CPC ... G09G 2310/0262; G09G 2310/0251; G09G 2310/027
USPC ........................................................ 345/76
See application file for complete search history.

(56) References Cited

U.S. PATENT DOCUMENTS

| | | | | |
|---|---|---|---|---|
| 6,040,208 | A | 3/2000 | Honeycutt et al. | |
| 6,274,421 | B1 | 8/2001 | Hsu et al. | |
| 6,580,094 | B1 | 6/2003 | Yamazaki et al. | |
| 7,361,534 | B2 | 4/2008 | Pelella | |
| 7,432,146 | B2 | 10/2008 | Yamamoto | |
| 7,838,883 | B2 | 11/2010 | Yamazaki et al. | |
| 8,017,945 | B2 | 9/2011 | Yamazaki et al. | |
| 8,772,766 | B2 | 7/2014 | Yamazaki et al. | |
| 9,023,678 | B2 | 5/2015 | Heo et al. | |
| 9,236,408 | B2 | 1/2016 | Yamazaki | |
| 9,711,549 | B2 | 7/2017 | Yamazaki et al. | |
| 9,748,292 | B2 | 8/2017 | Yamazaki | |
| 9,859,439 | B2 | 1/2018 | Miyairi | |
| 10,050,062 | B2 | 8/2018 | Sasagawa et al. | |
| 10,147,747 | B2 | 12/2018 | Toriumi et al. | |
| 2002/0084463 | A1* | 7/2002 | Sanford | G09G 3/3233 257/82 |
| 2002/0179908 | A1 | 12/2002 | Arao | |
| 2003/0025659 | A1 | 2/2003 | Kondo et al. | |
| 2003/0030144 | A1 | 2/2003 | Ono et al. | |
| 2003/0153155 | A1 | 8/2003 | Wang et al. | |
| 2005/0173761 | A1 | 8/2005 | Takafuji et al. | |
| 2005/0245046 | A1 | 11/2005 | Takafuji et al. | |
| 2006/0170634 | A1 | 8/2006 | Kawk et al. | |
| 2006/0205166 | A1 | 9/2006 | Ishikiriyama | |
| 2007/0164290 | A1 | 7/2007 | Yamazaki et al. | |
| 2007/0295961 | A1 | 12/2007 | Kim | |
| 2008/0169757 | A1 | 7/2008 | Chang et al. | |
| 2008/0191603 | A1 | 8/2008 | Kubota | |
| 2008/0210928 | A1 | 9/2008 | Abe et al. | |
| 2009/0114926 | A1 | 5/2009 | Yamazaki | |
| 2009/0152625 | A1 | 6/2009 | Lee et al. | |
| 2010/0025664 | A1 | 2/2010 | Park | |
| 2011/0233553 | A1 | 9/2011 | Sakakura et al. | |
| 2012/0105421 | A1* | 5/2012 | Tsai | G09G 3/3233 345/212 |
| 2012/0235973 | A1* | 9/2012 | Yoo | G09G 3/3233 345/211 |
| 2013/0001601 | A1 | 1/2013 | Lee et al. | |
| 2013/0328753 | A1* | 12/2013 | Tsuge | G09G 3/3233 345/77 |
| 2014/0034982 | A1 | 2/2014 | Yamazaki | |
| 2014/0131717 | A1 | 5/2014 | Qi et al. | |
| 2014/0159021 | A1 | 6/2014 | Song et al. | |
| 2014/0312334 | A1 | 10/2014 | Yamazaki et al. | |
| 2014/0367652 | A1 | 12/2014 | Cho et al. | |
| 2015/0108470 | A1 | 4/2015 | Yamazaki et al. | |
| 2015/0108475 | A1 | 4/2015 | Ando | |
| 2015/0270326 | A1 | 9/2015 | Hekmatshoartabari et al. | |
| 2015/0348997 | A1 | 12/2015 | Sasagawa et al. | |
| 2016/0172431 | A1 | 6/2016 | Huang et al. | |
| 2016/0181350 | A1 | 6/2016 | Lee | |
| 2016/0275870 | A1 | 9/2016 | Kimura et al. | |
| 2016/0322442 | A1 | 11/2016 | Lee et al. | |
| 2016/0327842 | A1 | 11/2016 | Qiao et al. | |
| 2016/0351589 | A1 | 12/2016 | Sasagawa et al. | |
| 2017/0011685 | A1 | 1/2017 | Jeon | |
| 2017/0047004 | A1 | 2/2017 | Yoon et al. | |
| 2017/0193879 | A1* | 7/2017 | Wang | G09G 3/2018 |
| 2017/0301293 | A1 | 10/2017 | Zhu | |
| 2018/0102092 | A1 | 4/2018 | Kubota et al. | |
| 2018/0151827 | A1 | 5/2018 | Kang et al. | |
| 2019/0251905 | A1 | 8/2019 | Yang et al. | |
| 2020/0279540 | A1 | 9/2020 | Wang | |
| 2021/0233968 | A1* | 7/2021 | Yang | H01L 27/3262 |

FOREIGN PATENT DOCUMENTS

| | | | |
|---|---|---|---|
| CN | 101980330 | A | 2/2011 |
| CN | 102760841 | A | 10/2012 |
| CN | 102983155 | A | 3/2013 |
| CN | 103022079 | A | 4/2013 |
| CN | 203026507 | U | 6/2013 |
| CN | 103403787 | A | 11/2013 |
| CN | 103440840 | A | 12/2013 |
| CN | 103515413 | A | 1/2014 |
| CN | 104025707 | A | 9/2014 |
| CN | 104201190 | A | 12/2014 |
| CN | 104240633 | A | 12/2014 |
| CN | 104299572 | A | 1/2015 |
| CN | 104332561 | A | 2/2015 |
| CN | 104380368 | A | 2/2015 |
| CN | 104681624 | A | 6/2015 |
| CN | 105225633 | A | 6/2015 |
| CN | 105185816 | A | 12/2015 |
| CN | 204966501 | U | 1/2016 |
| CN | 105304679 | A | 2/2016 |
| CN | 106159100 | A | 11/2016 |
| CN | 205789046 | U | 12/2016 |
| CN | 107086237 | A | 8/2017 |
| CN | 107103878 | A | 8/2017 |
| CN | 107424570 | A | 12/2017 |
| CN | 107591125 | A | 1/2018 |
| CN | 107768385 | A | 3/2018 |
| CN | 107799577 | A | 3/2018 |
| CN | 109036279 | A | 12/2018 |
| CN | 109119027 | A | 1/2019 |
| CN | 109215549 | A | 1/2019 |
| CN | 109509430 | A | 3/2019 |
| CN | 109904347 | A | 6/2019 |
| CN | 110071229 | A | 7/2019 |
| EP | 1096571 | A2 | 5/2001 |
| JP | H06347828 | A | 12/1994 |
| JP | 2000315734 | A | 11/2000 |
| JP | 2001195016 | A | 7/2001 |
| JP | 20011332383 | A | 11/2001 |
| JP | 2007156058 | A | 6/2007 |
| JP | 2008153191 | A | 7/2008 |
| JP | 2009003435 | A | 1/2009 |
| JP | 2009016410 | A | 1/2009 |
| JP | 20090369948 | A | 2/2009 |
| JP | 2011181938 | A | 9/2011 |
| KR | 1020080101732 | A | 11/2008 |
| KR | 101645404 | B1 | 8/2016 |
| KR | 1020170005252 | A | 1/2017 |

OTHER PUBLICATIONS

Machine English Translation of CN107591125, Sep. 23, 2021, 9 pages (Year: 2021).*

First Japanese Office Action from Japanese Patent Application No. 2017521204 dated Apr. 1, 2020.

Second Japanese Office Action from Japanese Patent Application No. 2017521204 dated Jun. 1, 2020.

First Office Action issued by the Korean Patent Office in the application No. 10-2017-7009789 dated Aug. 20, 2018.

Notice of Allowance from Korean Office Action in Korean Patent Application No. 10-2019-7009729 dated May 8, 2019.

European Extended Search Report from European Patent Application No. 16852868.5. dated May 9, 2019.

U.S. Non-Final Office Action from U.S. Appl. No. 15/521,612, filed Jul. 6, 2018.

U.S. Non-final Office Action from U.S. Appl. No. 15/521,612, filed Mar. 29, 2019.

U.S. Final Office Action from U.S. Appl. No. 15/521,612, filed Jan. 14, 2019.

Final US Office Action from U.S. Appl. No. 15/521,612, filed Oct. 1, 2019.

(56) References Cited

OTHER PUBLICATIONS

International Search Report for Chinese Patent Application No. PCT/CN2019/102293 dated Apr. 26, 2020.
International Search Report for Chinese Patent Application No. PCT-CN2019-102307 dated May 26, 2020.
International Search Report for Chinese Patent Application No. PCT-CN2019-102314 dated May 27, 2020.
International Search Report for Chinese Patent Application No. PCT-CN2019-102819 dated May 26, 2020.
International Preliminary Reporton Patentability for Chinese Patent Application No. PCT/CN2016/101999 dated Apr. 17, 2018.
International Search Report from International Application No. PCT/CN2016/101999 filed on Jan. 18, 2017.
Japanese Office Action from Japanese Patent Application No. 2017521204 dated Jan. 25, 2021.
First Chinese Office Action from Chinese Patent Application No. 201980001517.3 dated Sep. 1, 2021.
Extended European Search Report from Application No. 19932239.7 dated Aug. 1, 2022.
Extended European Search Report from Application No. 19933232.1 dated Sep. 6, 2022.
U.S. Office Action from U.S. Appl. No. 16/959,757 dated May 27, 2022.
U.S. Office Action from U.S. Appl. No. 16/812,619 dated May 16, 2022.
U.S. Office Action from U.S. Appl. No. 16/814,119 dated Apr. 20, 2022.
Indian Office Action from Indian Patent Application No. 202017056357 dated Mar. 29, 2022.
Indian Office Action from Indian Patent Application No. 202017056071 dated May 17, 2022.
Indian Office Action from Indian Patent Application No. 202017056072 dated Apr. 7, 2022.
First Chinese Office Action from Chinese Patent Application No. 201980001452.2 dated May 11, 2022.
Extended European Search Report from European Patent Application No. 19931503.7 dated May 30, 2022.
United Stated Office Action from U.S. Appl. No. 16/812,619 dated Jan. 7, 2022.
United States Office Action from U.S. Appl. No. 16/959,398 dated Nov. 26, 2021.
Extended European Search Report from European Patent Application No. 19933218.0 dated Nov. 16, 2022.

* cited by examiner

PIXEL CIRCUIT AND DRIVING METHOD THEREOF, DISPLAY SUBSTRATE AND DRIVING METHOD THEREOF, AND DISPLAY APPARATUS

TECHNICAL FIELD

The embodiments of the present disclosure relate to a pixel circuit and a driving method thereof, a display substrate and a driving method thereof, and a display apparatus.

BACKGROUND

Organic light-emitting diode (OLED) display panels have advantages of thin thickness, light weight, wide viewing angle, active light emission, continuous adjustability of luminous color, low cost, fast respond speed, low power consumption, low driving voltage, wide operating temperature range, simple production process, high luminous efficiency and being suitable for flexible display, etc., and have been more and more widely used in the display fields such as mobile phones, tablet computers, digital cameras, etc.

Different from a conventional OLED display device which adopts amorphous silicon, microcrystalline silicon, or polycrystalline silicon, etc., on a glass substrate, a silicon-based OLED display device takes a monocrystalline silicon chip as a substrate, and the pixel size thereof can be 1/10 of that of the conventional display device, such as less than 100 microns.

SUMMARY

At least one embodiment of the present disclosure provides a pixel circuit which includes a pixel sub-circuit; the pixel sub-circuit comprises a driving circuit, a voltage transmitting circuit, and a data writing circuit; the driving circuit comprises a control terminal, a first terminal and a second terminal; the voltage transmitting circuit is configured, in response to a transmission control signal, to apply a reset voltage and/or a first power voltage to the first terminal of the driving circuit, respectively; the data writing circuit is configured, in response to a scan signal, to write a data signal into the control terminal of the driving circuit and store the data signal being written; the driving circuit is configured to control a voltage of the second terminal of the driving circuit according to the data signal of the control terminal of the driving circuit and the voltage of the first terminal of the driving circuit, and to generate a driving current for driving a light-emitting element to emit light based on the voltage of the second terminal of the driving circuit; and the data writing circuit comprises two switching transistors of different types.

For example, the pixel circuit provided by some embodiments of the present disclosure further comprises a voltage control circuit, wherein the voltage control circuit is configured to provide the reset voltage to the voltage transmitting circuit in response to a reset control signal, and to provide the first power voltage to the voltage transmitting circuit in response to a light-emitting control signal.

For example, in the pixel circuit provided by some embodiments of the present disclosure, the voltage control circuit comprises a first control sub-circuit and a second control sub-circuit; the first control sub-circuit is configured to provide the reset voltage to the voltage transmitting circuit in response to the reset control signal; and the second control sub-circuit is configured to provide the first power voltage to the voltage transmitting circuit in response to the light-emitting control signal.

For example, in the pixel circuit provided by some embodiments of the present disclosure, the first control sub-circuit comprises a first switching transistor, and the second control sub-circuit comprises a second switching transistor; a gate electrode of the first switching transistor is connected to a reset control signal terminal to receive the reset control signal, a first electrode of the first switching transistor is connected to a reset voltage terminal to receive the reset voltage, and a second electrode of the first switching transistor is connected to a first node; a gate electrode of the second switching transistor is connected to a light-emitting control signal terminal to receive the light-emitting control signal, a first electrode of the second switching transistor is connected to a first power terminal to receive the first power voltage, and a second electrode of the second switching transistor is connected to the first node.

For example, in the pixel circuit provided by some embodiments of the present disclosure, the voltage transmitting circuit comprises a third switching transistor; a gate electrode of the third switching transistor is connected to a transmission control signal terminal to receive the transmission control signal, a first electrode of the third switching transistor is connected to the first node, and a second electrode of the third switching transistor is connected to a second node.

For example, in the pixel circuit provided by some embodiments of the present disclosure, the driving circuit comprises a driving transistor; a gate electrode of the driving transistor serves as the control terminal of the driving circuit and is connected to a fourth node, a first electrode of the driving transistor serves as the first terminal of the driving circuit and is connected to the second node, and a second electrode of the driving transistor serves as the second terminal of the driving circuit and is connected to a third node.

For example, in the pixel circuit provided by some embodiments of the present disclosure, the two switching transistors of different types in the data writing circuit comprise a fourth switching transistor and a fifth switching transistor, and the data writing circuit further comprises a storage capacitor; a gate electrode of the fourth switching transistor is connected to a scan signal terminal to receive the scan signal, a first electrode of the fourth switching transistor is connected to a data signal terminal to receive the data signal, and a second electrode of the fourth switching transistor is connected to the fourth node; a gate electrode of the fifth switching transistor is configured to receive an inverted signal of the scan signal, a first electrode of the fifth switching electrode is connected to the data signal terminal to receive the data signal, and a second electrode of the fifth switching transistor is connected to the fourth node; and a first terminal of the storage capacitor is connected to the fourth node, and a second terminal of the storage capacitor is connected to a first voltage.

For example, in the pixel circuit provided by some embodiments of the present disclosure, a first electrode of the light-emitting element is coupled to the third node, and a second electrode of the light-emitting element is connected to a second power terminal to receive a second power voltage.

For example, in the pixel circuit provided by some embodiments of the present disclosure, the pixel sub-circuit further comprises a current transmitting circuit, and the current transmitting circuit is configured to transmit the driving current generated by the driving circuit to the light-emitting element.

For example, in the pixel circuit provided by some embodiments of the present disclosure, the current transmitting circuit comprises a sixth switching transistor; a gate electrode of the sixth switching transistor is connected to a second voltage terminal to receive a second voltage, a first electrode of the sixth switching transistor is connected to the third node, a second electrode of the sixth switching transistor is coupled to a first electrode of the light-emitting element, and a second electrode of the light-emitting element is connected to a second power terminal to receive a second power voltage; and the sixth switching transistor is substantially kept in an on state under control of the second voltage.

For example, in the pixel circuit provided by some embodiments of the present disclosure, a type of the sixth switching transistor is different from a type of the driving transistor.

At least one embodiment of the present disclosure further provides a display substrate, which comprises the pixel circuit according to any one embodiment of the present disclosure, wherein the display substrate comprises a display region, the display region comprises a plurality of sub-pixels arranged in an array, and each of the plurality of sub-pixels comprises the light-emitting element and the pixel sub-circuit coupled to the light-emitting element.

For example, in the display substrate provided by some embodiments of the present disclosure, the pixel circuit further comprises a voltage control circuit, the voltage control circuit is configured to provide the reset voltage to the voltage transmitting circuit in response to a reset control signal, and to provide the first power voltage to the voltage transmitting circuit in response to a light-emitting control signal; the display substrate further comprises a non-display region; the non-display region comprises a plurality of voltage control circuits, and each of the plurality of voltage control circuits is coupled to the pixel sub-circuits in at least one row of sub-pixels.

For example, the display substrate provided by some embodiments of the present disclosure further comprises a plurality of voltage transmission lines in one-to-one correspondence with respective rows of sub-pixels, wherein the pixel sub-circuits in each row of sub-pixels are connected to the voltage control circuit through a voltage transmission line corresponding to the each row of sub-pixels, and the voltage transmission line is configured to transmit the reset voltage and the first power voltage.

For example, in the display substrate provided by some embodiments of the present disclosure, the display substrate comprises a silicon-based base substrate, the pixel circuit is at least partially formed in the silicon-based base substrate, and the light-emitting element is formed on the pixel circuit.

For example, in the display substrate provided by some embodiments of the present disclosure, the light-emitting element comprises one selected from the group consisting of an organic light-emitting diode, a quantum dot light-emitting diode and an inorganic light-emitting diode.

At least one embodiment of the present disclosure further provides a display apparatus, which comprises: the display substrate according to any one embodiment of the present disclosure.

At least one embodiment of the present disclosure further provides a driving method corresponding to the pixel circuit according to any one embodiment of the present disclosure, which comprises a reset stage, a data writing stage and a light-emitting stage; in the reset stage, input the reset control signal and the transmission control signal to turn on the voltage control circuit and the voltage transmitting circuit, and apply the reset voltage to the first terminal of the driving circuit through the voltage control circuit and the voltage transmitting circuit, so as to reset the light-emitting element; in the data writing stage, input the scan signal to turn on the data writing circuit, write the data signal into the control terminal of the driving circuit through the date writing circuit, and store, by the data writing circuit, the data signal being written; and in the light-emitting stage, input the light-emitting control signal and the transmission control signal to turn on the voltage control circuit, the voltage transmitting circuit and the driving circuit, and apply the first power voltage to the first terminal of the driving circuit through the voltage control circuit and the voltage transmitting circuit, so that the driving circuit controls the voltage of the second terminal of the driving circuit according to the data signal of the control terminal of the driving circuit and the first power voltage of the first terminal of the driving circuit, and generates the driving current for driving the light-emitting element to emit light based on the voltage of the second terminal of the driving circuit.

For example, in the driving method of the pixel circuit provided by some embodiments of the present disclosure, after the light-emitting stage, the driving method further comprises a non-light-emitting stage; and in the non-light-emitting stage, stop inputting the transmission control signal to turn off the voltage transmitting circuit, so that the first power voltage is unable to be applied to the first terminal of the driving circuit, to stop the light-emitting element from emitting light.

For example, the driving method of the pixel circuit provided by some embodiments of the present disclosure further comprises: controlling a display grayscale of the light-emitting element by adjusting a magnitude of the data signal and a time duration of the transmission control signal in the light-emitting stage.

For example, in the driving method of the pixel circuit provided by some embodiments of the present disclosure, the controlling the display grayscale of the light-emitting element by adjusting the magnitude of the data signal and the time duration of the transmission control signal in the light-emitting stage, comprises: in a case where a target display grayscale of the light-emitting element is less than a preset value, keeping the magnitude of the data signal unchanged, and adjusting the time duration of the transmission control signal at the light-emitting stage to cause the display grayscale of the light-emitting element to conform to the target display grayscale; and in a case where the target display grayscale of the light-emitting element is not less than a preset value, keeping the time duration of the transmission control signal at the light-emitting stage unchanged, and adjusting the magnitude of the data signal to cause the display grayscale of the light-emitting element to conform to the target display grayscale.

At least one embodiment of the present disclosure further provides a driving method corresponding to the display substrate according to any one embodiment of the present disclosure, which comprises: during a display time period of one frame, causing all rows of sub-pixels to progressively enter a reset stage, a data writing stage and a light-emitting stage; wherein in the reset stage of each row of sub-pixels, input the reset control signal and the transmission control signal to turn on the voltage control circuit and the voltage transmitting circuit, and apply the reset voltage to the first terminal of the driving circuit through the voltage control circuit and the voltage transmitting circuit, so as to reset the light-emitting element; in the data writing stage of each row of sub-pixels, input the scan signal to turn on the data writing circuit, write the data signal into the control terminal of the driving circuit through the date writing circuit, and store, by the data writing circuit, the data signal being written; and in the light-emitting stage of each row of sub-pixels, input the light-emitting control signal and the transmission control signal to turn on the voltage control circuit, the voltage transmitting circuit and the driving circuit, and apply the first power voltage to the first terminal of the driving circuit through the voltage control circuit and the voltage transmitting circuit, so that the driving circuit controls the voltage of the second terminal of the driving circuit according to the data signal of the control terminal of the driving circuit and the first power voltage of the first terminal of the driving circuit, and generates the driving current for driving the light-emitting element to emit light based on the voltage of the second terminal of the driving circuit.

For example, the driving method of the display substrate provided by some embodiments of the present disclosure further comprises: during the display time period of one frame, causing all rows of sub-pixels to progressively enter a non-light-emitting stage; wherein in the non-light-emitting stage of each row of sub-pixels, stop inputting the transmission control signal to turn off the voltage transmitting circuit, so that the first power voltage is unable to be applied to the first terminal of the driving circuit, to stop the light-emitting elements of the each row of sub-pixels from emitting light.

For example, the driving method of the display substrate provided by some embodiments of the present disclosure further comprises: during the display time period of one frame, causing all rows of sub-pixels to simultaneously enter a non-light-emitting stage; wherein in the non-light-emitting stage of all rows of sub-pixels, stop inputting the transmission control signal to turn off the voltage transmitting circuit, so that the first power voltage is unable to be applied to the first terminal of the driving circuit, to stop the light-emitting elements of all rows of sub-pixels from emitting light, simultaneously.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
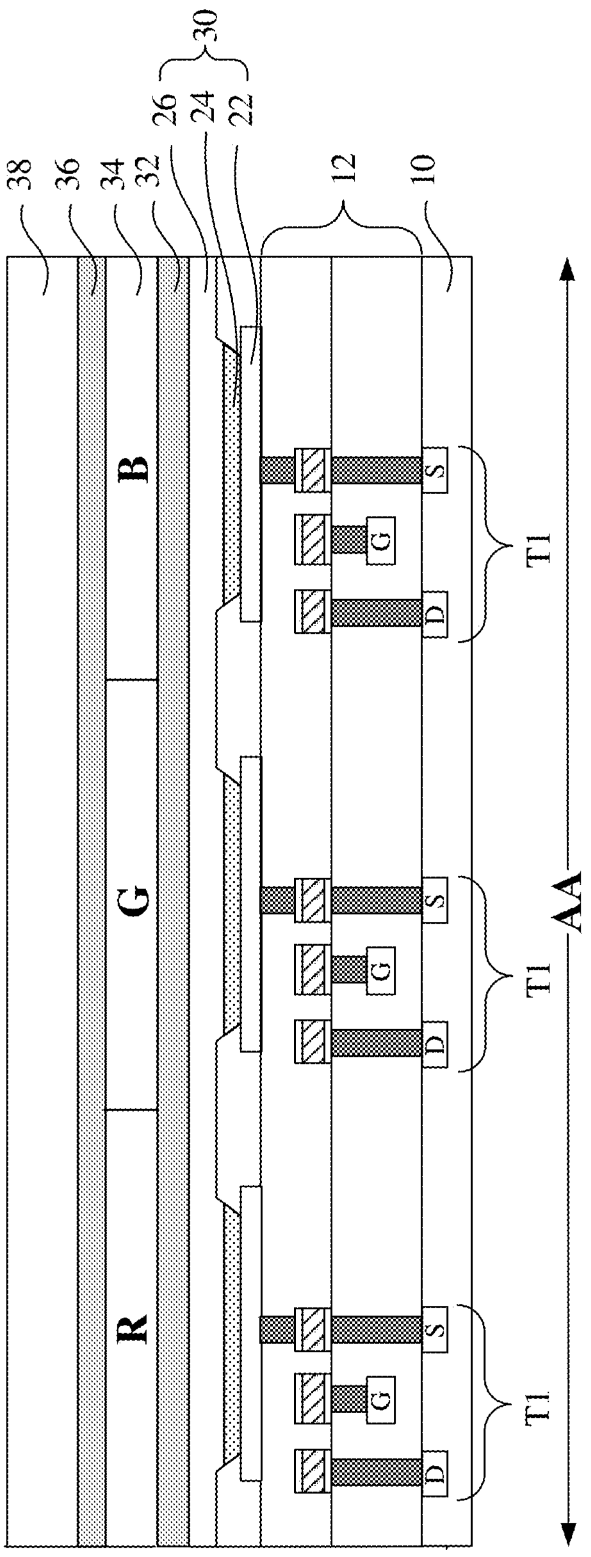
FIG. 1 is a schematic structural diagram of a silicon-based OLED display device.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "a," "an," "the," etc., are not intended to indicate a limitation of quantity, but indicate the presence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below with reference to several specific embodiments. In order to keep the following description of the embodiments of the present disclosure clear and concise, detailed descriptions of known functions and known components or elements may be omitted. When any one component or element of an embodiment of the present disclosure appears in more than one of the accompanying drawings, the component or element is denoted by a same or similar reference numeral in each of the drawings.

FIG. 1 is a schematic structural diagram of a silicon-based OLED display device. As shown in FIG. 1, the silicon-based OLED display device includes a silicon-based base substrate 10 and a pixel circuit layer 12 on the silicon-based base substrate. For example, the pixel circuit layer 12 can include a plurality of pixel circuits, which are configured to respectively drive a plurality of light-emitting elements (i.e., OLEDs) to be subsequently formed. The circuit structure and layout of the pixel circuit can be designed according to actual needs, without being limited in the present disclosure. It should be noted that, for clarity and conciseness, FIG. 1 merely illustratively shows one transistor T1 in each pixel circuit, and the transistor T1 is to be coupled with a light-emitting element to be subsequently formed. For example, the pixel circuit layer 12 can further include various wirings such as scan signal lines and data signal lines, etc., without being limited in the present disclosure.

For example, as shown in FIG. 1, taking the transistor T1 as an example, each of the transistors in the pixel circuit layer 12 includes a gate electrode G, a source electrode S, and a drain electrode D. For example, these three electrodes are electrically connected to three electrode connection portions, respectively, for example, through via holes filled with tungsten metal (i.e., W-via); furthermore, these three electrodes can be electrically connected to other electrical structures (e.g., transistors, wirings, light-emitting elements, etc.) through the corresponding electrode connection portions, respectively.

For example, the silicon-based base substrate 10 and the pixel circuit layer 12 can be fabricated in a front-end wafer factory by processing a monocrystalline silicon wafer.

As shown in FIG. 1, the silicon-based OLED display device further includes a plurality of light-emitting elements 30 formed on the pixel circuit layer 12. For example, each light-emitting element 30 includes a first electrode 22 (for example, as an anode), an organic light-emitting functional layer 24 and a second electrode 26 (for example, as a cathode) that are sequentially stacked. For example, the first electrode 22 can be electrically connected to the source electrode S of the transistor T1 in a corresponding pixel circuit through a W-via (and through a connection portion corresponding to the source electrode S); and it can be understood that positions of the source electrode S and the drain electrode D are interchangeable, that is, the first electrode 22 can be electrically connected to the drain electrode D, instead. For example, the organic light-emitting functional layer 24 can include an organic light-emitting layer, and can further include one or more selected from the group consisting of an electron injection layer, an electron transport layer, a hole injection layer, and a hole transport layer. For example, the second electrode 26 is a transparent electrode; and for example, the second electrode 26 is a common electrode, that is, the plurality of light-emitting elements 30 share a second electrode 26 of an entire surface. For example, the light color of the light-emitting element 30 can be white, but is not limited thereto.

As shown in FIG. 1, the silicon-based OLED display device further includes a first encapsulation layer 32, a color filter layer 34, a second encapsulation layer 36, and a cover plate 38 that are sequentially disposed on the plurality of light-emitting elements 30. For example, the first encapsulation layer 32 and the second encapsulation layer 36 can be polymer or/and ceramic thin film encapsulation layers, but are not limited thereto. For example, the color filter layer 34 includes a red filter unit R, a green filter unit G, and a blue filter unit R, but is not limited thereto. For example, one filter unit together with a corresponding light-emitting element and a corresponding pixel circuit can be divided into one sub-pixel; and for example, the red filter unit R, the green filter unit G and the blue filter unit R correspond to a red sub-pixel and a green sub-pixel and a blue sub-pixel, respectively. For example, the material of the color filter layer 34 can be a material commonly used in the art. For example, the cover plate 138 can be a glass cover plate, but is not limited thereto.

For example, the light-emitting element 30 including the first electrode 22, the organic light-emitting functional layer 24 and the second electrode 26, together with the first encapsulation layer 32, the color filter layer 34, the second encapsulation layer 36 and the cover 38, can all be fabricated in a rear-end panel factory.

It should be noted that FIG. 1 merely illustratively shows the structure of the display region (also referred to as an active area (AA)) of a silicon-based OLED display device. The silicon-based OLED display device can further include a non-display region (a region other than the display region). For example, in accordance with different structures and functions of respective regions in the non-display region, the non-display region can be further divided into a dummy region, a bonding region (BA), and an IC function block, etc. For example, the structure of the dummy region is basically the same as that of the display region, which can be used to ensure uniformity of the display region; for example, the bonding region includes pads for electrical connection with external circuits and signal transmission; for example, the IC function block can be used to set a gate driving circuit (for example, the gate driving circuit is formed by using GOA technique) and circuits with other functions, etc., therein.

The silicon-based OLED display device has a relatively small pixel size (for example, less than 100 microns), and can be used for micro-display applications. However, the pixel circuit generally includes a plurality of transistors and capacitors. Due to limitations of accuracy in preparation process, the pixel circuit usually occupies a large area in the sub-pixel, which is not conducive to reducing the pixel size or to achieving display of a high resolution (Pixel Per Inch (PPI)).

At least one embodiment of the present disclosure provides a pixel circuit. The pixel circuit can include a pixel sub-circuit. The pixel sub-circuit includes a driving circuit, a voltage transmitting circuit, and a data writing circuit; the driving circuit includes a control terminal, a first terminal and a second terminal; the voltage transmitting circuit is configured, in response to a transmission control signal, to apply a reset voltage and/or a first power voltage to the first terminal of the driving circuit, respectively; the data writing circuit is configured, in response to a scan signal, to write a data signal into the control terminal of the driving circuit and store the data signal being written; the driving circuit is configured to control a voltage of the second terminal of the driving circuit according to the data signal of the control terminal of the driving circuit and the voltage of the first terminal of the driving circuit, and to generate a driving current for driving a light-emitting element to emit light based on the voltage of the second terminal of the driving circuit; and the data writing circuit includes two switching transistors of different types. The pixel circuit can further include a voltage control circuit. The voltage control circuit is configured to provide the reset voltage to the voltage transmitting circuit in response to a reset control signal, and to provide the first power voltage to the voltage transmitting circuit in response to a light-emitting control signal.

Some embodiments of the present disclosure further provide, corresponding to the pixel circuit, a driving method, a display substrate, a driving method of the display substrate, and a display apparatus.

In the pixel circuit provided by at least one embodiment of the present disclosure, the structure of the pixel sub-circuit is relatively simple, and can be disposed in the sub-pixel in the display region, thereby reducing the area occupied by the pixel circuit in the sub-pixel, which is conducive to achieving display of a high resolution (high PPI); at the same time, the data writing circuit adopts two switching transistors of different types, which can increase a range of the voltage value of the data signal; and in addition, the voltage transmitting circuit provided in the pixel circuit can be used to ensure uniformity of pulse width modulation (PWM) control of the sub-pixel.

Hereinafter, some embodiments of the present disclosure and examples thereof are described in detail with reference to the accompanying drawings.

Figure 2:
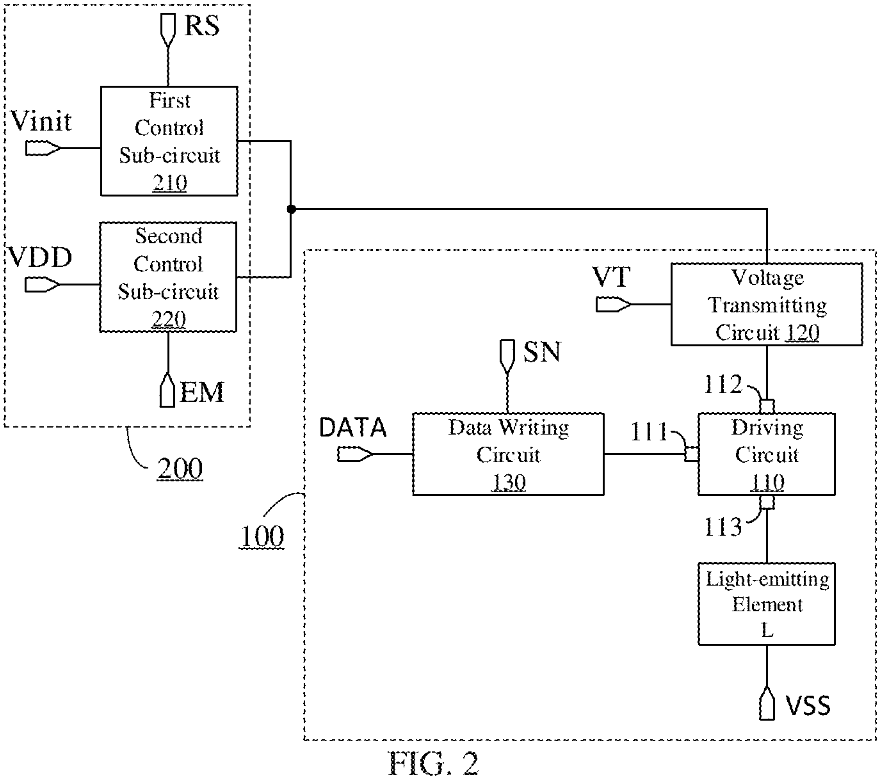
FIG. 2 is a schematic block diagram of a pixel circuit provided by at least one embodiment of the present disclosure.

FIG. 2 is a schematic block diagram of a pixel circuit provided by at least one embodiment of the present disclosure. As shown in FIG. 2, the pixel circuit includes a voltage control circuit 200 and a pixel sub-circuit 100.

For example, the voltage control circuit 200 is configured to provide a reset voltage Vinit to the pixel sub-circuit 100 (e.g., to provide the reset voltage Vinit to a voltage transmitting circuit 120 in the pixel sub-circuit 100 to be described later) in response to a reset control signal RS, and to provide a first power voltage VDD to the pixel sub-circuit 100 (e.g., to provide the first power voltage VDD to the voltage transmitting circuit 120 in the pixel sub-circuit 100 to be described later) in response to a light-emitting control signal EM. For example, the first power voltage VDD can be a driving voltage, such as a high voltage.

For example, as shown in FIG. 2, the voltage control circuit 200 includes a first control sub-circuit 210 and a second control sub-circuit 220.

For example, the first control sub-circuit 210 is configured to provide the reset voltage Vinit to the pixel sub-circuit 100 in response to the reset control signal RS, for example, to provide the reset voltage Vinit to the voltage transmitting circuit 120 in the pixel sub-circuit 100 to be described later. For example, in some examples, in a reset stage, the first control sub-circuit 210 is turned on in response to the reset control signal RS, so as to provide the reset voltage Vinit to the pixel sub-circuit 100, and to reset the light-emitting element L through the pixel sub-circuit 100.

For example, the second control sub-circuit 220 is configured to provide the first power voltage VDD to the pixel sub-circuit 100 in response to the light-emitting control signal EM, for example, to provide the first power voltage VDD to the voltage transmitting circuit 120 in the pixel sub-circuit 100 to be described later. For example, in some examples, in a light-emitting stage, the second control sub-circuit 220 is turned on in response to the light-emitting control signal EM to provide the first power voltage VDD to the pixel sub-circuit 100, so as to drive the pixel sub-circuit 100 to generate a driving current, and further to drive the light-emitting element L to emit light. For example, in some examples, after the light-emitting stage lasts for a period of time, the input of the light-emitting control signal EM can be stopped, and the second control sub-circuit can be turned off, so that the first power voltage VDD cannot be provided to the pixel sub-circuit 100, and thus the pixel sub-circuit 100 cannot generate the driving current, the light-emitting element L stops emitting light and enters a non-light-emitting stage; and for example, in some examples, after the non-light-emitting stage lasts for a period of time, the light-emitting control signal EM can be input again to, so that the light-emitting element L to return to the light-emitting stage. Therefore, after entering the light-emitting stage, the light-emitting time of the light-emitting element L can be controlled by controlling whether the light-emitting control signal EM is input or not, thereby realizing PWM dimming.

For example, as shown in FIG. 2, the pixel sub-circuit 100 includes a driving circuit 110, a voltage transmitting circuit 120 and a data writing circuit 130.

For example, the driving circuit 110 includes a control terminal 111, a first terminal 112 and a second terminal 113, and is configured to control a voltage of the second terminal 113 according to a voltage of the control terminal 111 (e.g., a voltage of a data signal) and a voltage of the first terminal 112 (e.g., the first power voltage), and to generate a driving current for driving the light-emitting element L to emit light based on the voltage of the second terminal 113. For example, in some examples, in the light-emitting stage, the driving circuit 110 can control a voltage Vs of the second terminal 113 according to the voltage of the control terminal 111 (e.g., the voltage of the data signal) and the voltage of the first terminal 112 (e.g., the first power voltage VDD), and generate a driving current based on the voltage Vs, so as to provide the driving current to the light-emitting element L to drive the light-emitting element L to emit light, and to provide a corresponding driving current according to a grayscale desired to be displayed to drive the light-emitting element L to emit light. It should be noted that, in the embodiments of the present disclosure, the grayscale displayed by the light-emitting element L is not only related to a magnitude of the driving current, but also related to a time duration in which the driving current is applied to the light-emitting element L (i.e., the light-emitting time of the light-emitting element L).

For example, the voltage transmitting circuit 120 is configured, in response to a transmission control signal VT, to apply the reset voltage Vinit and/or the first power voltage VDD to the first terminal 112 of the driving circuit 110, respectively. That is to say, in some examples, the voltage transmitting circuit 120 is configured to apply the reset voltage Vinit to the first terminal 112 of the driving circuit 110 in response to the transmission control signal VT; in some other examples, the voltage transmitting circuit 120 is configured to apply the first power voltage VDD to the first terminal 112 of the driving circuit 110 in response to a transmission control signal VT; in still some other examples, the voltage transmitting circuit 120 is configured, in response to a transmission control signal VT, to apply the reset voltage Vinit and the first power voltage VDD to the first terminal 112 of the driving circuit 110 in a time-divisional manner. For example, in some examples, in the reset stage, the voltage transmitting circuit 120 is turned on in response to the transmission control signal VT, so as to apply the reset voltage Vinit provided by the first control sub-circuit 210 to the first terminal 112 of the driving circuit 110; because the driving circuit 110 remains in an on state under the control of the data signal of a previous frame, the reset voltage Vinit can be transmitted to the light-emitting element L through the driving circuit 110, so as to reset the light-emitting element L. For example, in some examples, in the light-emitting stage, the voltage transmitting circuit 120 is turned on in response to the transmission control signal VT, so as to apply the first power voltage VDD provided by the second control sub-circuit 220 to the first terminal 112 of the driving circuit 110; because the driving circuit 110 remains in an on state under the control of the data signal in a current frame, the driving circuit 110 can generate a driving current under the drive of the first power voltage VDD, so as to drive the light-emitting element L to emit light. For example, in some examples, after entering the light-emitting stage, the voltage transmitting circuit 120 can be controlled to be turned on or off by controlling whether the transmission control signal VT is input or not, so as to control the light-emitting time of the light-emitting element L, and further to realize PWM dimming. For example, specific details can be referred to the related description of controlling the light-emitting time of the light-emitting element L by controlling whether the light-emitting control signal EM is input or not, and will not be repeated here.

It should be noted that, after entering the light-emitting stage, the light-emitting time of the light-emitting element L can be controlled by controlling whether or not to input the light-emitting control signal EM and/or the transmission control signal VT, which is not limited in the embodiment of the present disclosure.

For example, the data writing circuit 130 is configured, in response to a scan signal SN, to write a data signal DATA into the control terminal 111 of the driving circuit 110 and store the data signal DATA being written. For example, the data writing circuit 130 further includes a storage capacitor, which can receive and store the data signal DATA being written. For example, in some examples, in a data writing stage, the data writing circuit 130 is turned on in response to the scan signal SN, so as to write the data signal DATA into the control terminal 111 of the driving circuit 110; and meanwhile, the storage capacitor can store the data signal DATA being written, and then the data signal DATA being stored can be used to control the driving circuit 110 in the light-emitting stage, so that the driving circuit 110 generates a driving current to drive the light-emitting element L to emit light based on the data signal DATA. For example, the data writing circuit includes two switching transistors of different types, and for example, the two switching transistors are turned on in response to the scan signal SN. For example, specifically, one of the two switching transistors is turned on in response to the scan signal SN, and the other of the two switching transistors is turned on in response to an inverted signal SN' of the scan signal SN.

For example, as shown in FIG. 2, a first electrode (e.g., an anode) of the light-emitting element L is coupled to the second terminal 113 of the driving circuit 110, and a second electrode (e.g., a cathode) is coupled to a second power terminal to receive a second power voltage VSS. For example, the second power voltage VSS can be a low voltage; and for example, the second power voltage VSS can be a zero voltage or a ground voltage.

Figure 3:
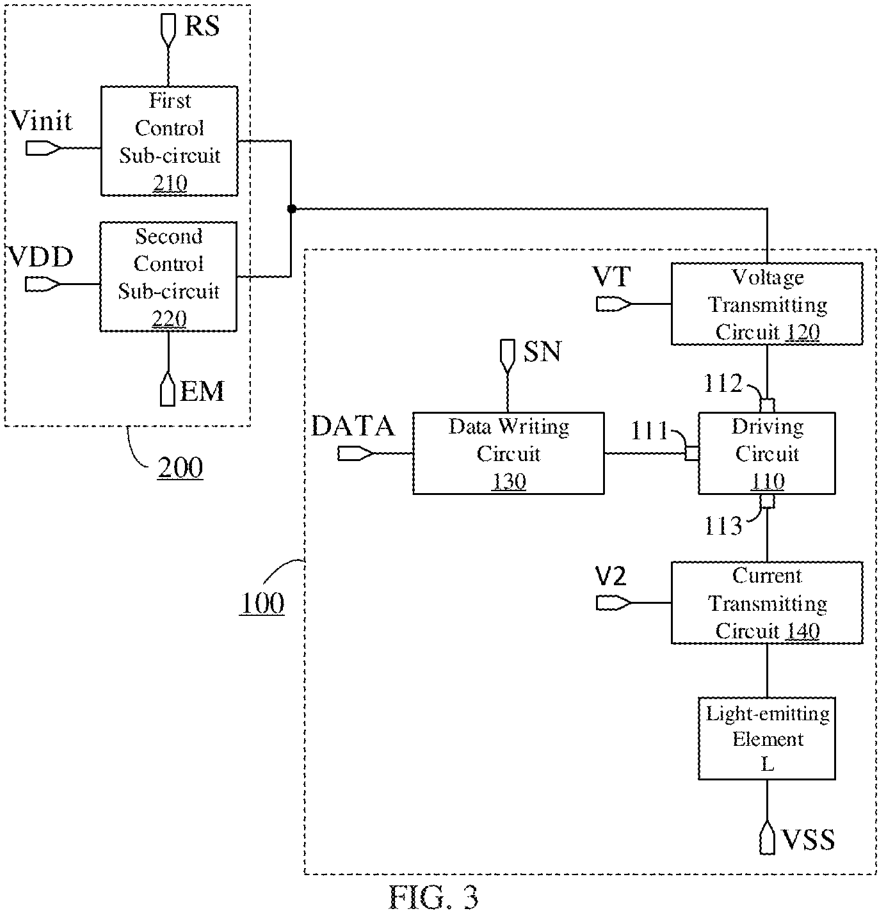
FIG. 3 is a schematic block diagram of another pixel circuit provided by at least one embodiment of the present disclosure.

FIG. 3 is a schematic block diagram of another pixel circuit provided by at least one embodiment of the present disclosure. As shown in FIG. 3, on the basis of the pixel circuit shown in FIG. 2, the pixel circuit shown in FIG. 3 further includes a current transmitting circuit 140. It should be noted that other circuit structures (such as the voltage control circuit 200, the driving circuit 110, the voltage transmitting circuit 120, the data writing circuit 130, etc.) in the pixel circuit shown in FIG. 3 are basically the same as those of the pixel circuit shown in FIG. 2, and details will not be repeated here.

For example, as shown in FIG. 3, the first electrode (e.g., the anode) of the light-emitting element L is coupled to the second terminal 113 of the driving circuit 110 through the current transmitting circuit 140, and the second electrode (e.g., the cathode) is coupled to the second power terminal to receive the second power voltage VSS. For example, the current transmitting circuit 140 is configured to transmit the driving current generated by the driving circuit 110 to the light-emitting element L. For example, in some examples, a control terminal of the current transmitting circuit 140 is connected to a second voltage terminal to receive a second voltage V2, and the current transmitting circuit 140 is substantially kept in an on state under the control of the second voltage V2; thus, in the reset stage, the current transmitting circuit 140 allows the reset voltage Vinit to be transmitted to the light-emitting element L, and in the light-emitting stage, the current transmitting circuit 140 allows the driving current generated by the driving circuit 110 to be transmitted to the light-emitting element L.

For example, in some examples, by selecting an appropriate second voltage V2, the current transmitting circuit 140 can function as a current clamp. For example, in the case where a relatively high grayscale is displayed, the current transmitting circuit 140 has a relatively high on degree under the control of the second voltage V2 and the voltage of the second terminal of the driving circuit 110, so that the light-emitting element L can have a relatively high light-emitting brightness; for example, in the case where a relatively low grayscale is displayed, the current transmitting circuit 140 has a relatively low on degree under the control of the second voltage V2 and the voltage of the second terminal of the driving circuit 110, so that the light-emitting element L can have a relatively low light-emitting brightness; and for example, in the case where a lowest grayscale is displayed, the current transmitting circuit 140 has an extremely low on degree (e.g., close to an off state) under the control of the second voltage V2 and the voltage of the second terminal of the driving circuit 110, so that the light-emitting element L basically does not emit light. Thus, the display contrast of the display substrate can be improved.

Figure 4:
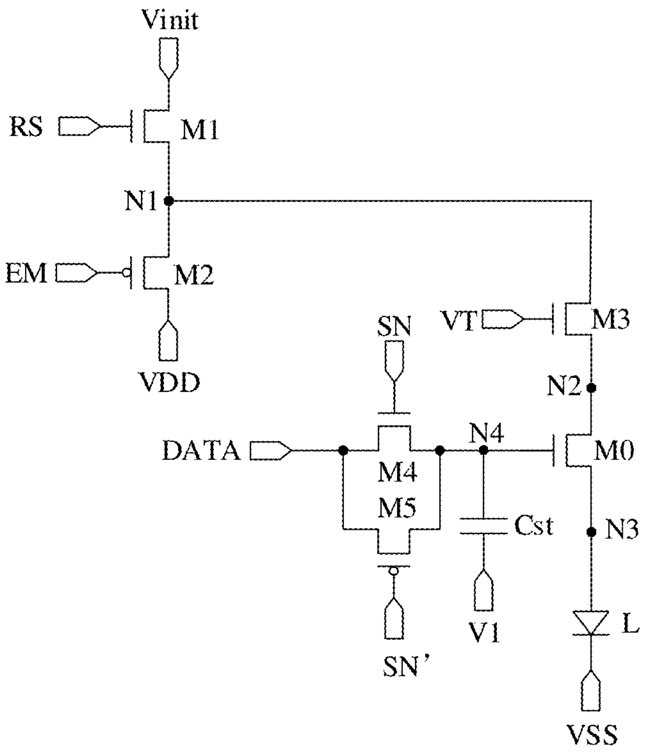
FIG. 4 is a schematic circuit diagram of a specific implementation example of the pixel circuit shown in FIG. 2.

FIG. 4 is a schematic circuit diagram of a specific implementation example of the pixel circuit shown in FIG. 2. As shown in FIG. 4, the pixel sub-circuit 100 includes a driving transistor M0, a first switching transistor M1, a second switching transistor M2, a third switching transistor M3, a fourth switching transistor M, a fifth switching transistor M5, and a storage capacitor Cst. For example, FIG. 4 also shows the light-emitting element L. For example, the light-emitting element L can include one selected from the group consisting of an organic light-emitting diode, a quantum dot light-emitting diode, and an inorganic light-emitting diode. For example, the light-emitting element L can adopt a micron-level light-emitting element, such as a Micro-LED, a Mini-LED, etc., and the embodiments of the present disclosure include but are not limited thereto. It should be noted that the types of the switching transistors in FIG. 4 are all illustrative, and should not be considered as limitations to the embodiments of the present disclosure.

For example, as shown in FIG. 4, the first control sub-circuit 210 in the voltage control circuit 200 can be implemented as the first switching transistor M1. A gate electrode of the first switching transistor M1 is connected to a reset control signal terminal to receive the reset control signal RS, a first electrode of the first switching transistor M1 is connected to a reset voltage terminal to receive the reset voltage Vinit, and a second electrode of the first switching transistor M1 is connected to a first node N1. For example, as shown in FIG. 4, the first switching transistor M1 can be an N-type transistor, and the embodiments of the present disclosure include but are not limited thereto. For example, the reset voltage Vinit can be a zero voltage or a ground voltage, or can be any other fixed voltage, such as a low voltage, etc., without being limited in the embodiments of the present disclosure. For example, in the case where the reset control signal RS is at a high level, the N-type first switching transistor M1 is turned on; and in the case where the reset control signal RS is at a low level, the N-type first switching transistor M1 is turned off.

For example, as shown in FIG. 4, the second control sub-circuit 220 in the voltage control circuit 200 can be implemented as the second switching transistor M2. A gate electrode of the second switching transistor M2 is connected to the light-emitting control signal terminal to receive the light-emitting control signal EM, a first electrode of the second switching transistor M2 is connected to the first power terminal to receive the first power voltage VDD, and a second electrode of the second switching transistor M2 is connected to the first node N1. For example, as shown in FIG. 4, the second switching transistor M2 can be a P-type transistor, and the embodiments of the present disclosure include but are not limited thereto. For example, the first power voltage VDD can be a driving voltage, such as a high voltage. For example, in the case where the light-emitting control signal EM is at a low level, the P-type second switching transistor M2 is turned on; and in the case where the light-emitting control signal EM is at a high level, the P-type second switching transistor M2 is turned off.

For example, as shown in FIG. 4, the voltage transmitting circuit 120 in the pixel sub-circuit 100 can be implemented as the third switching transistor M3. A gate electrode of the third switching transistor M3 is connected to a transmission control signal terminal to receive the transmission control signal VT, a first electrode of the third switching transistor M3 is connected to the first node N1, and a second electrode of the third switching transistor M3 is connected to a second node N2. For example, as shown in FIG. 4, the third switching transistor M3 can be an N-type transistor, and the embodiments of the present disclosure include but are not limited thereto. For example, in the case where the transmission control signal VT is at a high level, the N-type third switching transistor M3 is turned on; and in the case where the transmission control signal VT is at a low level, the N-type third switching transistor M3 is turned off.

For example, as shown in FIG. 4, the driving circuit 110 in the pixel sub-circuit 100 can be implemented as the driving transistor M0. A gate electrode of the driving transistor M0 serves as the control terminal 111 of the driving circuit 110 and is connected to a fourth node N4, a first electrode of the driving transistor M0 serves as the first terminal 112 of the driving circuit 110 and is connected to the second node N2, and a second electrode of the driving transistor M0 serves as the second terminal 113 of the driving circuit 110 and is connected to a third node N3. For example, as shown in FIG. 4, the driving transistor M0 can be an N-type transistor, and the embodiments of the present disclosure include but are not limited thereto.

For example, as shown in FIG. 4, the data writing circuit 130 in the pixel sub-circuit 100 can be implemented as the fourth switching transistor M4 and the storage capacitor Cst. A gate electrode of the fourth switching transistor M4 is connected to a scan signal terminal to receive the scan signal SN, a first electrode of the fourth switching transistor M4 is connected to a data signal terminal to receive the data signal DATA, a second electrode of the fourth switching transistor M4 is connected to the first fourth node N4, a first terminal of the storage capacitor Cst is connected to the fourth node N4 (i.e., coupled to the gate electrode of the driving transistor M0), and a second terminal of the storage capacitor Cst is connected to a first voltage terminal to receive a first voltage V1. For example, the first voltage V1 can be a fixed voltage, such as a zero voltage or a ground voltage. For example, the storage capacitor Cst can store the data signal DATA written into the fourth node N4 (i.e., the gate electrode of the driving transistor M0). For example, as shown in FIG. 4, the fourth switching transistor M4 can be an N-type transistor, and the embodiments of the present disclosure include but are not limited thereto. For example, in the case where the scan signal SN is at a high level, the N-type fourth switching transistor M4 is turned on; and in the case where the scan signal SN is at a low level, the N-type fourth switching transistor M4 is turned off.

For example, in some examples, as shown in FIG. 4, the data writing circuit 130 in the pixel sub-circuit 100 can further include a fifth switching transistor M5, that is, the data writing circuit 130 can be implemented as the fourth switching transistor M4, the fifth switching transistor M5 and the storage capacitor Cst. A gate electrode of the fifth switching transistor M5 is configured to receive an inverted signal SN' of the scan signal SN, a first electrode of the fifth switching transistor M5 is connected to the data signal terminal to receive the data signal DATA, and a second electrode of the fifth switching transistor M5 is connected to the fourth node N4. For example, the fifth switching transistor M5 and the fourth switching transistor M4 are of different types; for example, as shown in FIG. 4, in the case where the fourth switching transistor is an N-type transistor, the fifth switching transistor M4 is a P-type transistor. For example, in the case where the scan signal SN is at a high level, the inverted signal SN is at a low level, and the P-type fifth switching transistor M5 is turned on; and in the case where the scan signal SN is at a low level, the inverted signal SN' is at a high level, and the P-type fifth switching transistor M5 is turned off. That is, the fifth switching transistor M5 and the fourth switching transistor M4 can be turned on at the same time and can be turned off at the same time. For example, the fifth switching transistor M5 and the fourth switching transistor M4 can be transistor devices with symmetrical structures; and for example, the fifth switching transistor M5 and the fourth switching transistor M4 can form a transmission gate (also referred to as an analog switch).

For example, the inverted signal SN' of the scan signal SN can be obtained by inputting the scan signal SN to an inverter circuit, and the embodiments of the present disclosure include but are not limited thereto. For example, the scan signal SN can be input to an input terminal of the inverter circuit, so that the inverted signal SN' is output by an output terminal of the inverter circuit. For example, the inverter circuit can be provided in each sub-pixel in the display region AA, or can be provided in the non-display region NA and be set to transmit the inverted signal SN' of the scan signal SN to each row of sub-pixels through wiring. For example, the inverter circuit can be implemented in a common way, which will not be repeated here.

In the case where the data writing circuit 130 includes only the fourth switching transistor M4, when the data writing circuit 130 writes the data signal DATA, the influence of a threshold voltage and an internal resistance of the fourth switching transistor M4 is necessary to be considered in general, so that the data signal DATA has a relatively small range of voltage value. The case in which the data writing circuit 130 includes only the fifth switching transistor M5 is similar to the case in which the data writing circuit 130 includes only the fourth switching transistor M4, and details will not be repeated here. In the case where the data writing circuit includes the fifth switching transistor M5 and the fourth switching transistor M4, the influence of threshold voltages and internal resistances of the two switching transistors is small, so that the range of voltage value of the data signal DATA can be enlarged. For example, the operation principle of the fifth switching transistor M5 and the fourth switching transistor M4 (i.e., the principle of enabling the data signal DATA to have a larger range of voltage value), can be referred to the operation principle of a common CMOS transmission gate which is used in an analog circuit, and details will not be repeated here.

For example, as shown in FIG. 4, a first electrode (e.g., an anode) of the light-emitting element L is coupled to the second electrode of the driving transistor M0, and a second electrode (e.g., a cathode) of the light-emitting element L is coupled to the second power terminal to receive the second power voltage VSS. For example, the second power voltage VSS can be a low voltage, and for example, the second power voltage VSS can be a zero voltage or a ground voltage.

Figure 5:
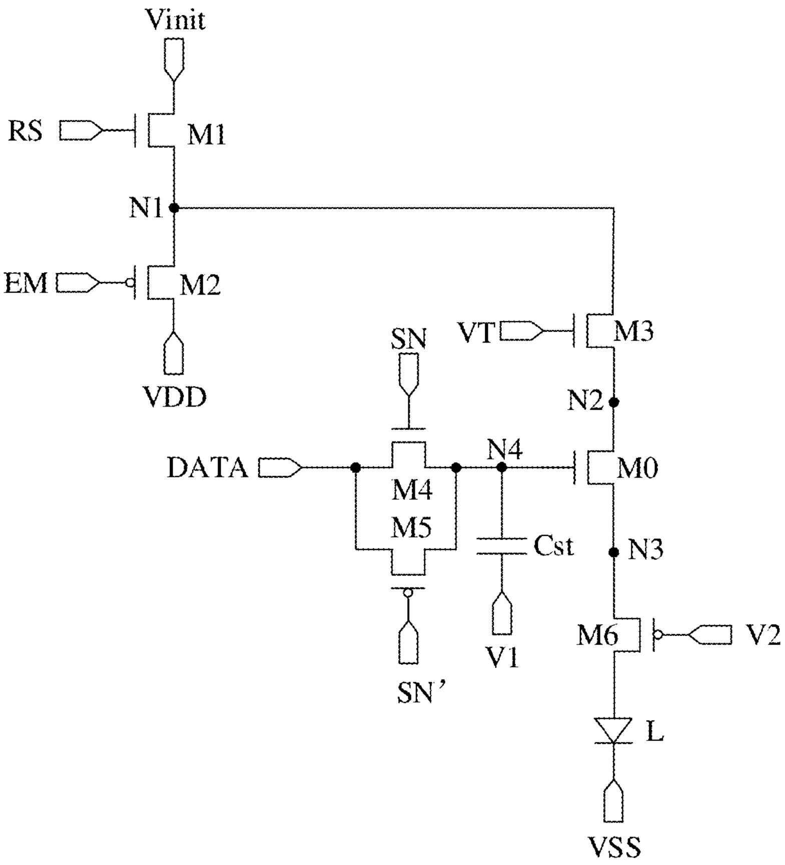
FIG. 5 is a schematic circuit diagram of a specific implementation example of the pixel circuit shown in FIG. 3.

FIG. 5 is a schematic circuit diagram of a specific implementation example of the pixel circuit shown in FIG. 3. As shown in FIG. 5, on the basis of the pixel circuit shown in FIG. 4, the pixel circuit shown in FIG. 5 further includes a sixth switching transistor M6. It should be noted that other circuit structures (such as the driving transistor M0, the first to fifth switching transistors M1-M5, the storage capacitor Cst, etc.) in the pixel circuit shown in FIG. 5 are basically the same as those of the pixel circuit shown in FIG. 4, and details will not be repeated here.

For example, as shown in FIG. 5, the current transmitting circuit 140 in the pixel sub-circuit 100 can be implemented as the sixth switching transistor M6. A gate electrode of the sixth switching transistor M6 is connected to the second voltage terminal to receive a second voltage V2, a first electrode of the sixth switching transistor M6 is connected to the third node N3, a second electrode of the sixth switching transistor M6 is coupled to the first electrode (e.g., the anode) of the light-emitting element L, and the second electrode (e.g., cathode) of the light-emitting element L is connected to the second power terminal to receive the second power voltage VSS. For example, as shown in FIG. 5, the sixth switching transistor M6 can be a P-type transistor, and the embodiments of the present disclosure include but are not limited thereto. For example, the type of the sixth switching transistor M6 can be different from the type of the driving transistor M0, and the embodiments of the present disclosure include but are not limited to thereto. For example, in the case where the driving transistor M0 is an N-type transistor, the sixth switching transistor M6 can be a P-type transistor; and in in the case where the driving transistor M0 is a P-type transistor, the sixth switching transistor M6 can be an N-type transistor. For example, in the case where the sixth switching transistor M6 is a P-type transistor, the second voltage V2 can be a zero voltage or a ground voltage, or can be any other fixed voltage, such as a low voltage. For example, the sixth switching transistor M6 is substantially kept in an on state under the control of the second voltage V2.

It should be noted that, in the embodiments of the present disclosure, the storage capacitor Cst can be a capacitance device manufactured by a process. For example, the capacitor device is implemented by manufacturing specific capacitor electrodes, and respective electrodes of the capacitor can be implemented by a metal layer, a semiconductor layer (e.g., doped poly-silicon) etc. Moreover, the capacitor can also be a parasitic capacitance between various devices, which can be realized by a transistor itself and other devices and wirings. A connection mode of the capacitor is not limited to the mode described above, or can be any other suitable connection mode as long as the voltage of the corresponding node can be stored.

It should be noted that, in the description of the embodiments of the present disclosure, the first node N1, the second node N2, the third node N3, and the fourth node N4 do not represent components that must actually exist, but represent junction points of related electrical connections in the circuit diagram.

It should be noted that all the transistors used in the embodiments of the present disclosure can be thin film transistors, field effect transistors, or other switching devices with the same characteristics, without being limited in the embodiments of the present disclosure. The source electrode and the drain electrode of the transistor used here can be symmetrical in structure, so the source electrode and the drain electrode can be structurally indistinguishable. In the embodiments of the present disclosure, in order to distinguish the two electrodes of the transistor other than the gate electrode, it is directly described that one of the electrodes is a first electrode and the other electrode is a second electrode. For example, in a specific implementation, taking a P-type transistor as an example, the first electrode can be a source electrode and the second electrode can be a drain electrode; and taking an N-type transistor as an example, the first electrode can be a drain electrode and the second electrode can be a source electrode. It should be noted that the embodiments of the present disclosure do not limit the type of each transistor. In a specific implementation, it is only necessary to connect the electrodes of a selected type of transistor with reference to the electrodes of the corresponding transistor in the embodiments of the present disclosure, and to cause the corresponding voltage terminal to provide the corresponding high voltage or low voltage.

Figure 6:
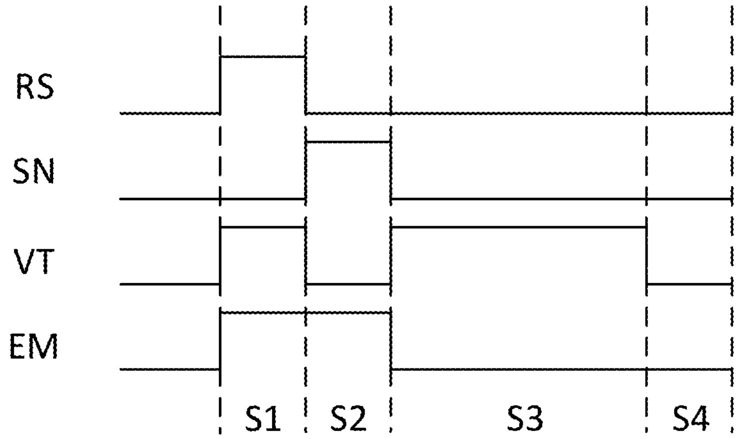
FIG. 6 is a signal timing chart of a driving method of a pixel circuit provided by at least one embodiment of the present disclosure.

At least one embodiment of the present disclosure further provides a driving method corresponding to the pixel circuit provided by the above embodiments. FIG. 6 is a signal timing chart of a driving method of a pixel circuit provided by at least one embodiment of the present disclosure. The driving method of the pixel circuit provided by the embodiment of the present disclosure will be described below with reference to the signal timing chart shown in FIG. 6. It should be noted that level of potential in the signal timing chart shown in FIG. 6 is merely illustrative, and does not represent a true potential value or a relative proportion. In the embodiment of the present disclosure, a low-level signal corresponds to a turn-on signal of the P-type transistor, while a high-level signal corresponds to a turn-off signal of the P-type transistor.

Hereinafter, taking the pixel circuit shown in FIG. 2 as an example, and referring to the circuit structure shown in FIG. 4 which is a specific implementation of the pixel circuit shown in FIG. 2, the driving method of the pixel circuit provided by the embodiments of the present disclosure will be described in detail.

For example, as shown in FIG. 6, the driving method provided in the present embodiment can include four stages, namely a reset stage S1, a data writing stage S2, a light-emitting stage S3, and a non-light-emitting stage S4. FIG. 6 shows timing waveforms of the control signals (the reset control signal RS, the scan signal SN, the transmission control signal VT and the light-emitting control signal EM) in each stage.

Figure 7:
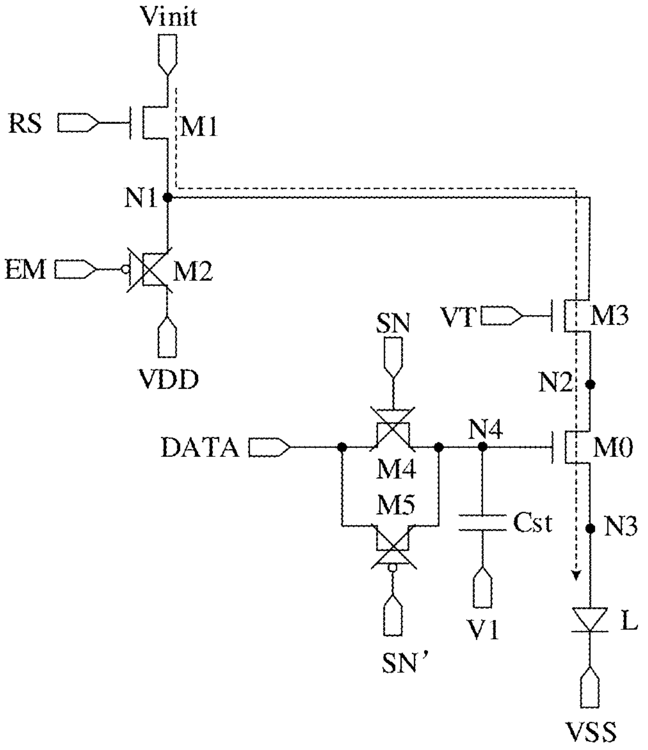
FIGS. 7-10 are schematic circuit diagrams of the circuit shown in FIG. 4 corresponding to four stages in FIG. 6.
Figure 8:
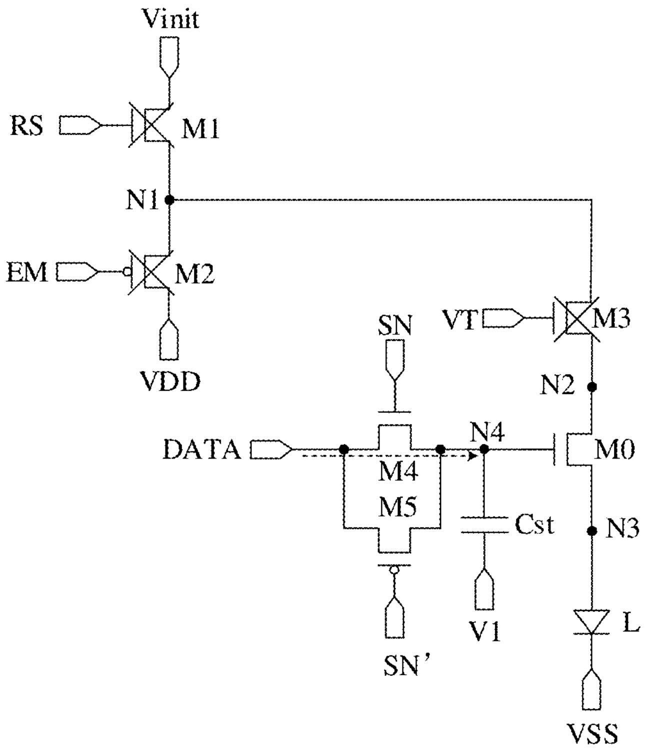
Figure 9:
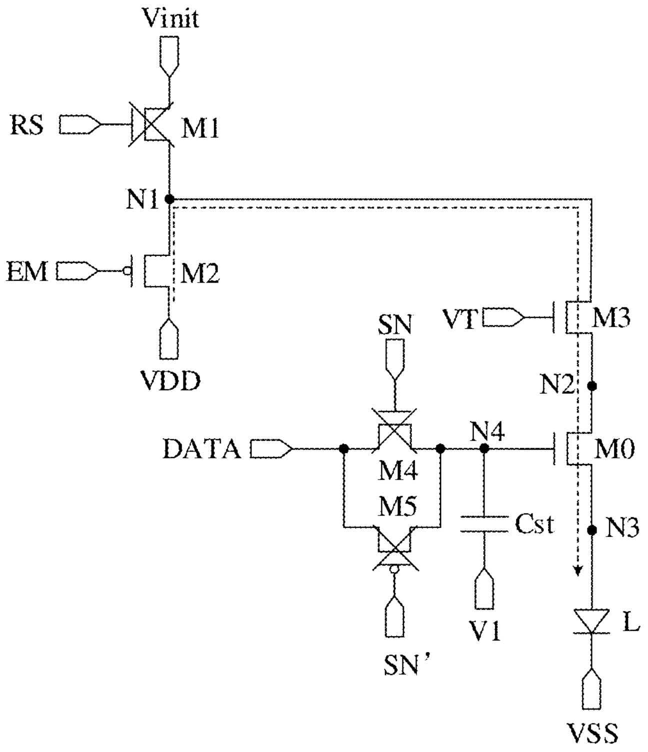
Figure 10:
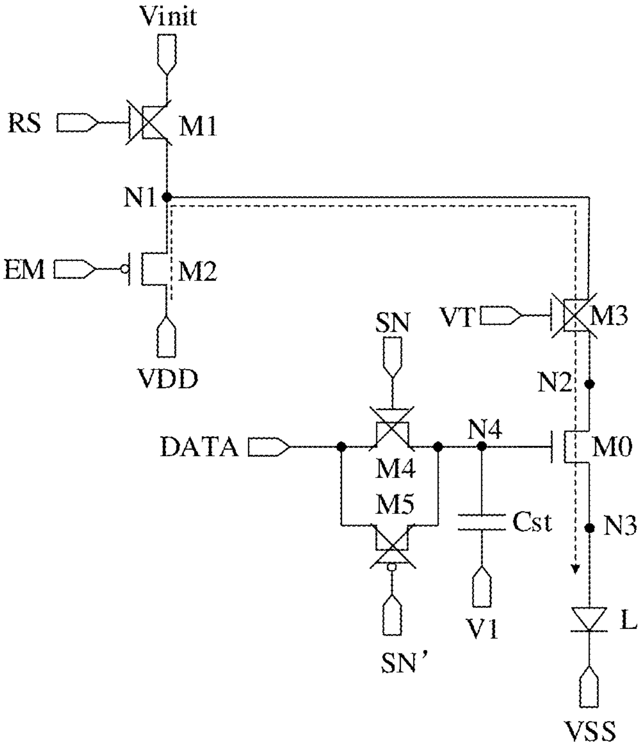

FIGS. 7-10 are schematic circuit diagrams of the circuit shown in FIG. 4 corresponding to the four stages in FIG. 6. Specifically, FIG. 7 is a schematic circuit diagram when the pixel circuit shown in FIG. 4 is in the reset stage S1, FIG. 8 is a schematic circuit diagram when the pixel circuit shown in FIG. 4 is in the data writing stage S2, FIG. 9 is a schematic circuit diagram when the pixel circuit shown in FIG. 4 is in the light-emitting stage S3, and FIG. 10 is a schematic circuit diagram when the pixel circuit shown in FIG. 4 is in the non-light-emitting stage S4. In addition, a transistors marked by a cross (X) in FIGS. 7-10 indicates that the transistor itself is in an off state in the corresponding stage, and a dashed line with an arrow in FIGS. 7-10 indicates a current path of the pixel circuit in the corresponding stage (the direction of the arrow does not indicate a current direction).

In the reset stage S1, the reset control signal RS and the transmission control signal VT are input, the voltage control circuit 200 and the voltage transmitting circuit 120 are turned on, and the reset voltage Vinit is applied to the first terminal 112 of the driving circuit 110 through the voltage control circuit 200 and the voltage transmitting circuit 120, so as to reset the light-emitting element L. For example, specifically, in the reset stage S1, the voltage control circuit 200 is turned on by turning on the first control sub-circuit 210, and the reset voltage Vinit is applied to the first terminal 112 of the driving circuit 110 through the first control sub-circuit 210 and the voltage transmitting circuit 120.

As shown in FIGS. 6 and 7, in the reset stage S1, the N-type first switching transistor M1 is turned on by the high level of the reset control signal RS, and the N-type third switching transistor M3 is turned on by the high level of the transmission control signal VT; meanwhile, the P-type second switching transistor M2 is turned off by the high level of the light-emitting control signal EM, the N-type fourth switching transistor M4 is turned off by the low level of the scan signal SN, and correspondingly, the P-type fifth switching transistor M5 is turned off by the high level of the inverted signal SN' of the scan signal SN; in addition, the driving transistor M0 is turned on by the voltage of the fourth node N4 (that is, the data signal DATA stored by the storage capacitor Cst during the display process of a previous frame of picture).

As shown in FIG. 7, in the reset stage S1, a reset path (as indicated by the dashed line with an arrow in FIG. 7) can be formed. Because the reset voltage Vinit is a low voltage (for example, a ground voltage or a zero voltage), the light-emitting element L can be reset through the reset path.

In the data writing stage S2, the scan signal SN is input, the data writing circuit 130 is turned on, the data signal DATA is written into the control terminal 111 of the driving circuit 110 through the data writing circuit 130, and the data writing circuit 130 stores the data signal DATA being written.

As shown in FIGS. 6 and 8, in the data writing stage S2, the N-type fourth switching transistor M4 is turned on by the high level of the scan signal SN, and correspondingly, the P-type fifth switching transistor M5 is turned on by the low level of the inverted signal SN' of the scan signal SN; meanwhile, the N-type first switching transistor M1 is turned off by the low level of the reset control signal RS, the P-type second switching transistor M2 is turned off by the high level of the light-emitting control signal EM, and the N-type third switching transistor M3 is turned off by the low level of the transmission control signal VT.

As shown in FIG. 8, in the data writing stage S2, a data writing path (as indicated by a dashed line with an arrow in FIG. 8) can be formed. The data signal DATA charges the first terminal (i.e., the fourth node N4, namely, the gate electrode of the driving transistor M0) of the storage capacitor Cst through the data writing path, so that the potential at the first terminal of the storage capacitor Cst becomes DATA, and the driving transistor M0 remains in an ON state under the control of the data signal DATA.

After the data writing stage S2, the potential at the first terminal of the storage capacitor Cst (i.e., the fourth node N4, that is, the gate electrode of the driving transistor M0) is DATA, that is, the voltage information of the data signal DATA is stored in the storage capacitor Cst, so as to be used to control the driving transistor M0 to generate a driving current in the subsequent light-emitting stage.

In the light-emitting stage S3, the light-emitting control signal EM and the transmission control signal VT are input, the voltage control circuit 200, the voltage transmitting circuit 120, and the driving circuit 110 are turned on, and the first power voltage VDD is applied to the first terminal 112 of the driving circuit 110 through the voltage control circuit 200 and the voltage transmitting circuit 120, so that the driving circuit 110 controls the voltage Vs of the second terminal 113 of the driving circuit 110 according to the data signal DATA of the control terminal 111 of the driving circuit 110 and the first power voltage VDD of the first terminal 112 of the driving circuit 110, and generates a driving current to drive the light-emitting element L to emit light based on the voltage Vs of the second terminal 113 of the driving circuit 110. For example, specifically, in the light-emitting stage S3, the voltage control circuit 200 is turned on by turning on the second control sub-circuit 220, and the first power voltage VDD is applied to the first terminal 112 of the driving circuit 110 through the second control sub-circuit 220 and the voltage transmitting circuit 120.

As shown in FIGS. 6 and 9, in the light-emitting stage S3, the P-type second switching transistor M2 is turned on by the low level of the light-emitting control signal EM, and the N-type third switching transistor M3 is turned on by the high level of the transmission control signal VT; meanwhile, the N-type first switching transistor M1 is turned off by the low level of the reset control signal RS, the N-type fourth switching transistor M4 is turned off by the low level of the scan signal SN, and correspondingly, the P-type fifth switching transistor M5 is turned off by the high level of the inverted signal SN' of the scan signal SN; in addition, the driving transistor M0 is turned on by the voltage of the fourth node N4 (i.e., the data signal DATA stored in the storage capacitor Cst in the data writing stage S2).

As shown in FIG. 9, in the light-emitting stage S3, a light-emitting path (as shown by a dashed line with an arrow in FIG. 9) can be formed. The first electrode (the anode) of the light-emitting element L is accessed to the first power voltage VDD (high voltage) through the light-emitting path, and the second electrode (the cathode) of the light-emitting element L is accessed to the second power voltage VSS (low voltage), so that the light-emitting element L can emit light under the action of the driving current flowing through the driving transistor M0. For example, in some examples, the driving transistor M0 operates in a sub-threshold region; and it should be noted that in the embodiment of the present disclosure, when the driving transistor M0 operates in the threshold region, the driving transistor M0 is considered to be turned on. The driving current generated by the driving transistor M0 can be obtained by a formula as follows:

$$I_L = I_0 \exp\left(\frac{q(Vgs - Vth)}{nkT}\right) = I_0 \exp\left(\frac{q(DATA - Vs - Vth)}{nkT}\right).$$

In the above formula, $I_L$ represents a driving current, $I_0$ represents a driving current when Vgs=Vth, Vth represents a threshold voltage of the driving transistor M0, Vgs represents a voltage difference between the gate electrode and the second electrode (e.g., source electrode) of the driving transistor M0, Vs represents a voltage of the second electrode of the driving transistor M0, q is an electron charge (a constant value), n is a channel doping concentration of the driving transistor M0, k is a constant value, and T is an operating temperature of the driving transistor M0.

In some embodiments of the present disclosure, the driving transistor M0 operates in the sub-threshold region, and Vgs<Vth; ideally, there is a linear relationship between the voltage Vs of the second electrode of the driving transistor M0 and the voltage DATA of the gate electrode of the driving transistor M0, i.e., $V_s = a \cdot Data + b$, where a and b are both constants. That is to say, the voltage of the second electrode of the driving transistor M0 changes linearly with the voltage of the gate electrode of the driving transistor M0. Therefore, the voltage Vs of the second electrode of the driving transistor M0 can be changed by adjusting the voltage of the gate electrode of the driving transistor M0 (i.e., the voltage of the data signal DATA), thereby changing the voltage difference between the two electrodes of the light-emitting element L, and further adjusting the light-emitting brightness of the light-emitting element L.

The above driving current $I_L$ is applied to the light-emitting element L through the light-emitting path, so that the light-emitting element L emits light under the action of the driving current flowing through the driving transistor M0. It should be noted that, in the display substrate provided by the embodiments of the present disclosure, the grayscale of light emission of the pixel circuit is not only related to the magnitude of the driving current, but also related to a time duration in which the driving current is applied to the light-emitting element (i.e., the light-emitting time of the light-emitting element). For example, the relationship between the grayscale of light emission of the pixel circuit and the magnitude of the driving current and the length of the light-emitting time can be determined via theoretical calculations, simulations, experimental measurements, etc. Furthermore, based on the relationship, a desired grayscale can be displayed by simultaneously controlling the magnitude of the driving current and the length of the light-emitting time. For example, in some examples, the above driving method can insert a non-light-emitting stage S4 after the light-emitting stage S3 to control the length of the light-emitting time of the light-emitting element.

In the non-light-emitting stage S4, the input of the transmission control signal VT is stopped, and the voltage transmitting circuit 120 is turned off, so that the first power voltage VDD cannot be applied to the first terminal 112 of the driving circuit 110, so as to cause the light-emitting element L to stop emitting light.

As shown in FIGS. 6 and 10, after the light-emitting stage S3 lasts for a period of time, the input of the transmission control signal VT can be stopped (other control signals remain in the states in the light-emitting stage S3); for example, the transmission control signal VT is changed from the high level to the low level, to cause the third switching transistor M3 to be turned off, so that the first power voltage VDD cannot be applied to the first terminal of the driving transistor M0, the light-emitting path in FIG. 9 is disconnected, the driving transistor M0 cannot generate a driving current, and the light-emitting element L stops emitting light, that is, enters the non-light-emitting stage S4.

For example, in some examples, after the non-light-emitting stage S4 lasts for a period of time, the transmission control signal VT can be input again so that the light-emitting element L returns to the light-emitting stage S3, that is, the light-emitting stage S3 and the non-light-emitting stage S4 can be alternated. For example, based on the switching between the light-emitting stage S3 and the non-light-emitting stage S4, PWM dimming can be achieved.

It should be noted that the switching between the light-emitting stage S3 and the non-light-emitting stage S4 can also be realized by using other methods, and is not limited to the above-mentioned method. For example, the switching between the light-emitting stage S3 and the non-light-emitting stage S4 can be realized by controlling whether or not to input the light-emitting control signal EM. It can be understood that the switching between the light-emitting stage S3 and the non-light-emitting stage S4 can also be realized by simultaneously controlling whether or not to input the light-emitting control signal EM and the transmission control signal VT.

It should be noted that, the current transmitting circuit 140 is substantially kept in an on state under the control of the second voltage V2, the pixel circuit shown in FIG. 3 (for example, specifically implemented as the circuit structure shown in FIG. 5) can also be driven based on the timing chart of the various control signals shown in FIG. 6. Specific details can be referred to the related description of the foregoing driving method, and will not be repeated here.

It should be noted that the signal timing chart shown in FIG. 6 is illustrative. For the display substrate provided by the embodiments of the present disclosure, the signal timing thereof during operation can be determined according to actual needs, which is not limited in the embodiment of the present disclosure.

Figure 11:
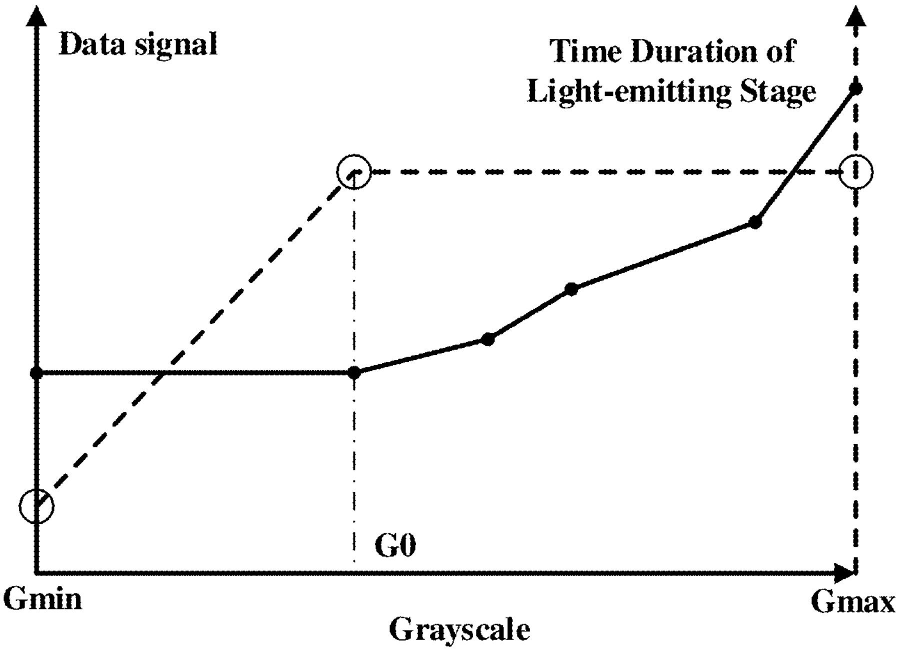
FIG. 11 is a schematic diagram of a principle of controlling a display grayscale in a driving method of a pixel circuit provided by at least one embodiment of the present disclosure.

FIG. 11 is a schematic diagram of a principle of controlling a display grayscale in a driving method of a pixel circuit provided by at least one embodiment of the present disclosure. For example, as shown in FIG. 11, in the driving method provided by the embodiment of the present disclosure, each sub-pixel can display a desired grayscale by simultaneously controlling the magnitude of the driving current and the length of the light-emitting time (i.e., the duration of the foregoing light-emitting stage described above).

For example, the magnitude of the driving current can be controlled correspondingly by adjusting the magnitude of the data signal DATA, and for example, this process can be referred to the foregoing formula of the driving current. For example, the length of the light-emitting time of the light-emitting element can be controlled by controlling the time duration of the light-emitting stage, and for example, the switching between the light-emitting stage and the non-light-emitting stage can be realized by controlling whether or not to input the light-emitting control signal EM and/or the transmission control signal VT, so as to control the length of the light-emitting time.

For example, in some examples, the driving method provided by the embodiment of the present disclosure can further include: controlling the display grayscale of the light-emitting element by adjusting the magnitude of the data signal DATA and the time duration of the transmission control signal VT in the light-emitting stage. For example, specifically, referring to FIG. 11, in the case where a target display grayscale of the light-emitting element is less than a preset value G0 (that is, the target display grayscale is between Gmin and G0, Gmin is the lowest grayscale), the magnitude of the data signal DATA is kept unchanged (correspondingly, the light-emitting brightness of the light-emitting element remains unchanged), and the time duration of the transmission control signal VT in the light-emitting stage (i.e., the light-emitting time of the light-emitting element) is adjusted to cause the display grayscale of the light-emitting element to conform to the target display grayscale; and in the case where the target display grayscale of the light-emitting element is not less than the preset value (that is, the target display grayscale is between G0~Gmax, Gmax is the highest grayscale), the time duration of the transmission control signal VT at the light-emitting stage is kept unchanged, and the magnitude of the data signal DATA is adjusted to cause the display grayscale of the light-emitting element to conform to the target display grayscale.

Figure 14:
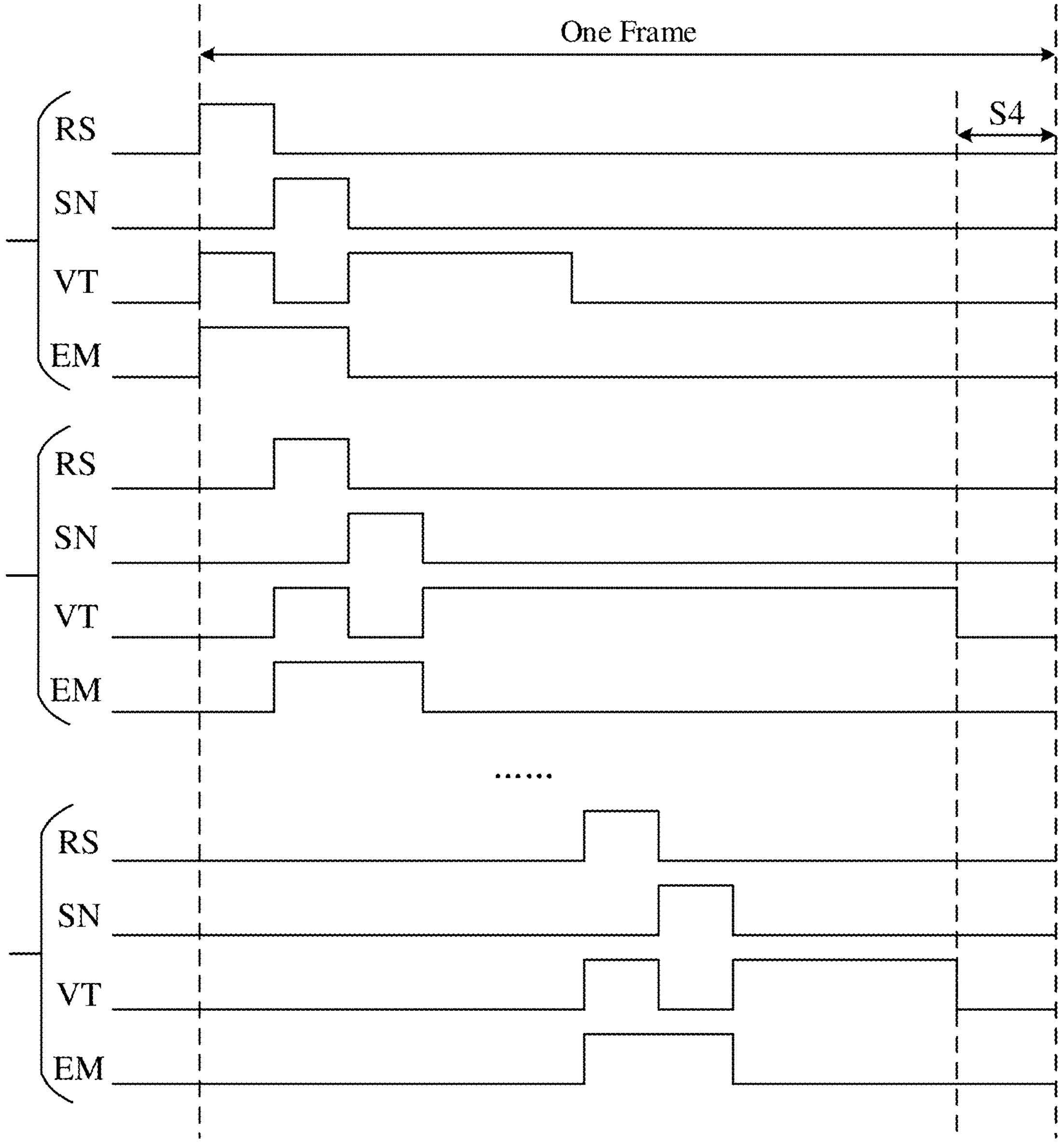
FIG. 14 is a signal timing chart of another driving method of display substrate provided by at least one embodiment of the present disclosure.

It should be noted that the preset value G0 can be determined according to actual needs, without being limited in the embodiment of the present disclosure. It should also be noted that the corresponding relationship between the data signal and the display grayscale (as shown by a solid lines and solid dots in the figure) and the corresponding relationship between the time duration of the light-emitting stage and the display grayscale (as shown by a dashed line and hollow circles in the figure) as shown in FIG. 14 are both illustrative, and both of them can be determined according to actual needs, without being limited in the embodiment of the present disclosure.

Technical effect of the driving method of the pixel circuit provided by the embodiments of the present disclosure can be referred to the related description of the pixel circuit in the foregoing embodiments, which will not be repeated here.

Figure 12:
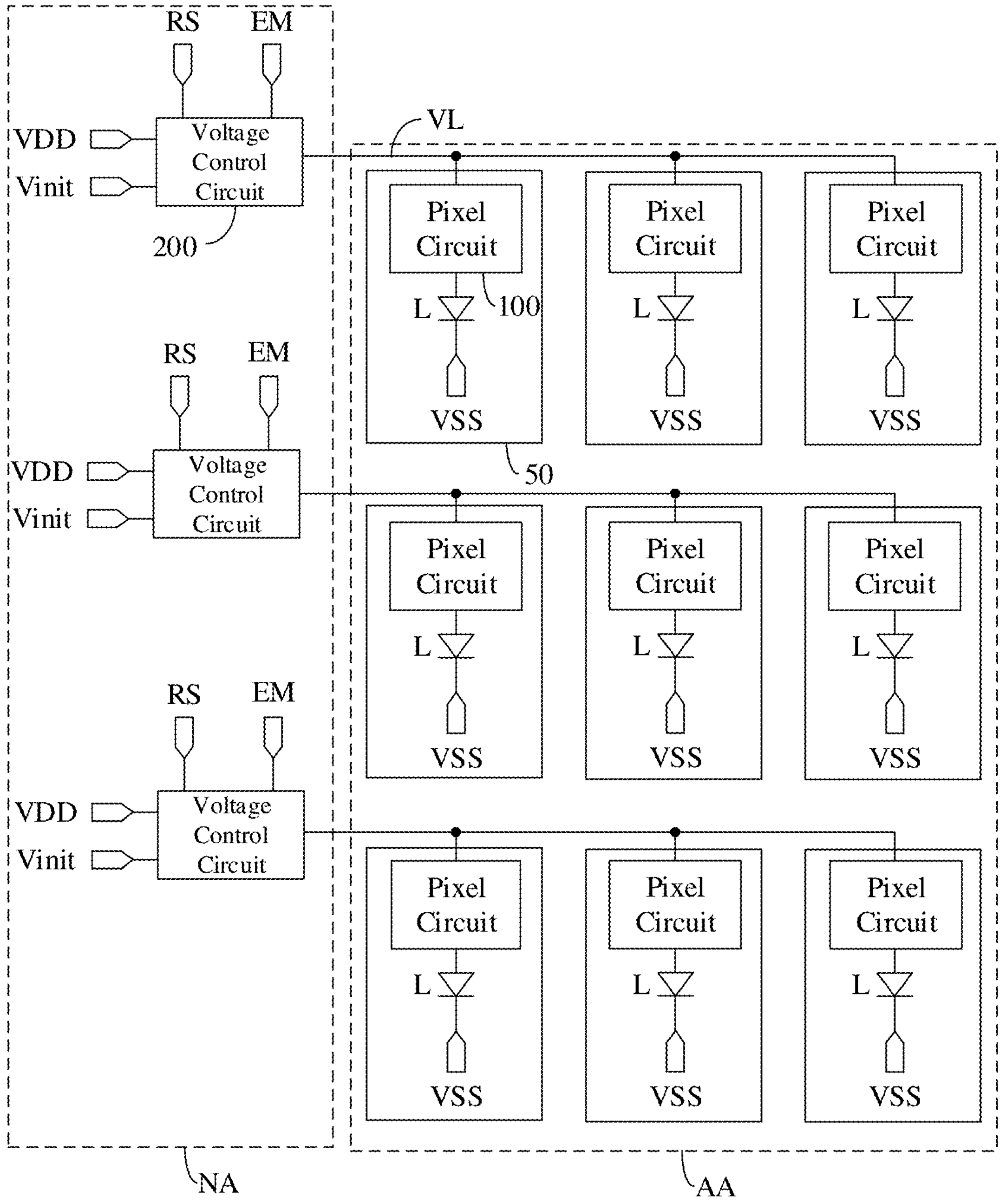
FIG. 12 is a schematic structural diagram of a display substrate provided by at least one embodiment of the present disclosure.

FIG. 12 is a schematic structural diagram of a display substrate provided by at least one embodiment of the present disclosure. For example, the display substrate includes the pixel circuit provided by any one of the above embodiments of the present disclosure. For example, the display substrate can be a silicon-based base substrate, and the embodiments of the present disclosure include but are not limited thereto. For example, a cross-sectional view of the structure of the display substrate can be referred to that of the structure of the silicon-based OLED display device shown in FIG. 1. For example, referring to FIG. 1, the pixel circuit (referring to the transistor shown in FIG. 1) can be at least partially formed in the silicon-based base substrate, and the light-emitting element can be formed on the pixel circuit. For example, for more details of the display substrate, reference can be made to the related description of the silicon-based OLED display device shown in FIG. 1, which will not be repeated here.

For example, as shown in FIG. 12, the display substrate includes a display region AA and a non-display region NA. For example, the non-display region NA is a region other than the display region AA on the display substrate. For example, in some examples, the non-display region NA surrounds the display region AA.

For example, as shown in FIG. 12, the display region AA of the display substrate includes a plurality of sub-pixels 50 arranged in an array. For example, the plurality of sub-pixels 50 can include multiple kinds of color sub-pixels, such as red sub-pixels, green sub-pixels, blue sub-pixels, etc. The embodiments of the present disclosure include but are not limited thereto. For example, the arrangement manner of the multiple kinds of color sub-pixels can be determined according to actual needs, without being limited in the embodiments of the present disclosure.

For example, as shown in FIG. 12, each sub-pixel 50 includes a light-emitting element L and a pixel sub-circuit 100 coupled to the light-emitting element L, and the pixel sub-circuit 100 can be configured to drive the light-emitting element L to emit light. That is, the pixel sub-circuit 100 in the above-mentioned pixel circuit can be disposed in the display region AA of the display substrate. For example, the light-emitting element L can include an organic light-emitting diode (OLED), and the embodiments of the present disclosure include but are not limited thereto; and for example, the light-emitting element L can also include a quantum dot light-emitting diode (QLED) or an inorganic light-emitting diode, etc. For example, the light-emitting element L can adopt a micron-level light-emitting element, such as a Micro-LED, a Mini-LED, etc. The embodiments of the present disclosure include but are not limited thereto.

For example, as shown in FIG. 12, the non-display region NA includes a plurality of voltage control circuits 200, and each voltage control circuit 200 is coupled to the pixel sub-circuits 100 in at least one row of sub-pixels 50. That is, the voltage control circuit in the above pixel circuit can be disposed in the non-display region NA of the display substrate. For example, after entering the light-emitting stage, the light-emitting time of the light-emitting elements L of at least one row (e.g., one or a plurality of rows) of sub-pixels coupled to one voltage control circuit 200 can be controlled by controlling whether or not to input the light-emitting control signal EM.

For example, as shown in FIG. 12, the display substrate further includes a plurality of voltage transmission lines VL in one-to-one correspondence with respective rows of sub-pixels 50. The pixel sub-circuits 100 in each row of sub-pixels 50 are connected to the voltage control circuit 200 through a voltage transmission line VL corresponding to the each row of sub-pixels, and the voltage transmission line VL is configured to transmit the reset voltage Vinit and the first power voltage VDD provided by the voltage control circuit 200 to the pixel sub-circuit 100.

For example, in the display substrate shown in FIG. 12, because the voltage control circuit 200 is disposed in the non-display region NA, wirings, such as a first power line for transmitting the first power voltage VDD, a reset control signal line for transmitting the reset control signal RS, and a light-emitting control signal line for transmitting the light-emitting control signal EM, can also be disposed in the non-display region NA accordingly. Therefore, a layout of wirings in the display region AA of the display substrate can be simplified, so that more sub-pixels 50 (that is, the pixel sub-circuits 100 and the light-emitting elements L, etc.) can be disposed in the display region AA, which is conducive to achieving display of a high resolution (high PPI). For example, in some examples, the voltage transmitting circuits 120 in the pixel sub-circuits 100 of each row of sub-pixels 50 can be connected to a same transmission control signal line, and the same transmission control signal line provides the transmission control signal VT; thus, after entering the light-emitting stage, the light-emitting time of the light-emitting elements L of each row of sub-pixels can be controlled by controlling whether or not to input the transmission control signal VT.

It should be noted that, in the embodiments of the present disclosure, because the voltage transmitting circuit 120 is located at an inner side of the sub-pixel 50 while the second control sub-circuit 220 is located at an outer side of the sub-pixel 50 (located in the non-display region NA), compared with a PWM control based on the second control sub-circuit 220 (i.e., to control whether or not to input the light-emitting control signal EM), a PWM control based on the voltage transmitting circuit 120 (i.e., to control whether or not to input the transmission control signal VT) can reduce the influence of the wiring load (e.g., parasitic capacitance and parasitic resistance, etc.), thereby better ensuring uniformity of the PWM control of the sub-pixels.

It should be noted that FIG. 12 merely illustratively shows a case in which each voltage control circuit 200 is coupled to the pixel sub-circuits 100 in a row of sub-pixels 50. The embodiments of the present disclosure include but are not limited thereto. For example, each voltage control circuit 200 can also be coupled to the pixel sub-circuits 100 in a plurality of rows (e.g., two rows, three rows, four rows, etc., and for example, the plurality of rows includes adjacent rows) of sub-pixels 50.

The display substrate provided by the embodiments of the present disclosure is provided with a voltage control circuit 200 in the non-display region NA, which can simplify the structure of the pixel sub-circuit 100 in each sub-pixel 50 and reduce an occupied area of the pixel sub-circuit 100 in each sub-pixel 50. Therefore, more sub-pixels 50 (that is, the pixel sub-circuits 100 and the light-emitting elements L, etc.) can be disposed in the display region AA, which is beneficial to achieving display of a high resolution (high PPI).

Figure 13:
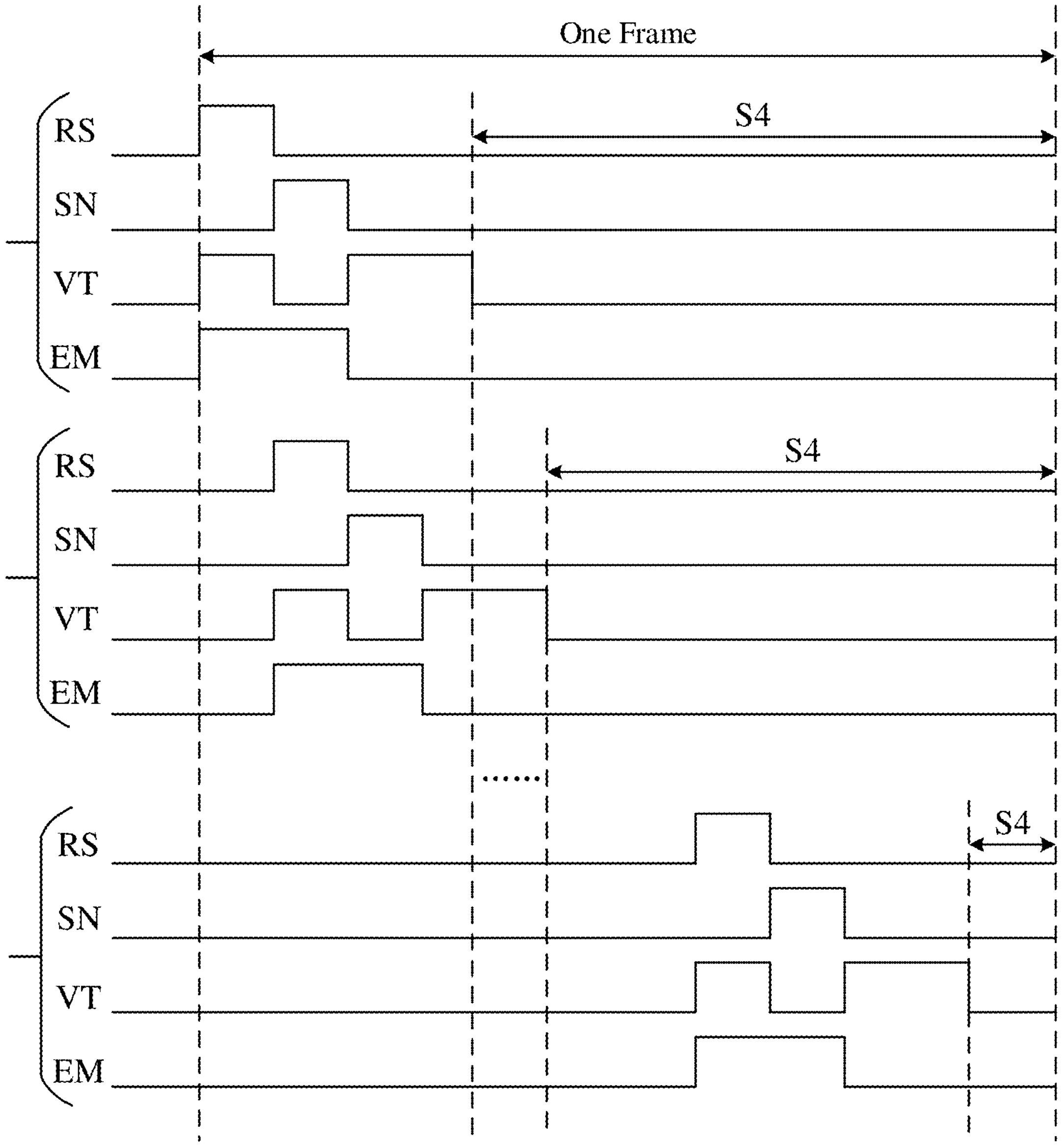
FIG. 13 is a signal timing chart of a driving method of a display substrate provided by at least one embodiment of the present disclosure.

FIG. 13 is a signal timing chart of a driving method of a display substrate provided by at least one embodiment of the present disclosure. For example, the signal timing chart shown in FIG. 6 can be used to drive a row of sub-pixels in the display substrate provided by the embodiments of the present disclosure, while the signal timing chart shown in FIG. 13 can be used to drive the display substrate (i.e., to drive all rows of sub-pixels in the display substrate).

For example, as shown in FIG. 13, the signal timing sequences corresponding to each row of sub-pixels (that is, the timing sequences of the reset control signal RS, the scan signal SN, the transmission control signal VT and the light-emitting control signal EM included in a brace) are basically the same as the signal timing sequences shown in FIG. 6, that is, the operation principle of each row of sub-pixels can be referred to the related description of the foregoing driving method, which will not be repeated here.

For example, as shown in FIG. 13, the driving method of the display substrate includes: during a display time period of one frame, causing all rows of sub-pixels to progressively enter a reset stage, a data writing stage, and a light-emitting stage. For example, the signal timing sequences corresponding to the reset stage, the data writing stage and the light-emitting stage of each row of sub-pixels, can be referred to the signal timing sequences corresponding to the reset stage, the data writing stage and the light-emitting stage shown in FIG. 6.

For example, in the reset stage of each row of sub-pixels, the reset control signal RS and the transmission control signal VT are input, the voltage control circuit 200 and the voltage transmitting circuit 120 are turned on, and the reset voltage Vinit is applied to the first terminal 112 of the driving circuit 110 through the voltage control circuit 200 and the voltage transmitting circuit 120, so as to reset the light-emitting elements L of the each row of sub-pixels. For example, specifically, in the reset stage, the voltage control circuit 200 is turned on by turning on the first control sub-circuit 210, and the reset voltage Vinit is applied to the first terminal 112 of the driving circuit 110 through the first control sub-circuit 210 and the voltage transmitting circuit 120. For example, specific details can be referred to the related description of the reset stage S1 in the driving method of the pixel circuit mentioned above, and will not be repeated here.

For example, in the data writing stage of each row of sub-pixels, the scan signal SN is input, the data writing circuit 130 is turned on, and the data signal DATA is written into the control terminal 111 of the driving circuit 110 through the data writing circuit 130, and the data writing circuit 130 stores the data signal DATA being written. For example, specific details can be referred to the related description to the related description of the data writing stage S2 in the driving method of the pixel circuit mentioned above, and will not be repeated here.

For example, in the light-emitting stage of each row of sub-pixels, the light-emitting control signal EM and the transmission control signal VT are input, the voltage control circuit 200, the voltage transmitting circuit 120 and the driving circuit 110 are turned on, and the first power voltage VDD is applied to the first terminal 112 of the driving circuit 110 through the voltage control circuit 200 and the voltage transmitting circuit 120, so that the driving circuit 110 controls the voltage Vs of the second terminal 113 of the driving circuit 110 according to the data signal DATA of the control terminal 111 of the driving circuit 110 and the first power voltage VDD of the first terminal 112 of the driving circuit 110, and generates a driving current for driving the light-emitting elements L of the each row of sub-pixels to emit light based on the voltage Vs of the second terminal 113 of the driving circuit 110. For example, specifically, in the light-emitting stage, the voltage control circuit 200 is turned on by turning on the second control sub-circuit 220, and the first power voltage VDD is applied to the first terminal 112 of the driving circuit 110 through the second control sub-circuit 220 and the voltage transmitting circuit 120. For example, specific details can be referred to the related description to the related description of the light-emitting stage S3 in the driving method of the pixel circuit mentioned above, and will not be repeated here.

For example, as shown in FIG. 13, the driving method of the display substrate can further include: during the display time period of one frame, causing all rows of sub-pixels to progressively enter a non-light-emitting stage. For example, as shown in FIG. 12, the light-emitting elements of all row of sub-pixels can enter the non-light-emitting stage S4 from the light-emitting stage progressively by stopping the input of the transmission control signal VT. The embodiments of the present disclosure include but are not limited to such a method of realizing the switching between the light-emitting stage and the non-light-emitting stage, and for example, other methods can be referred to the related descriptions in the driving method of the pixel circuit mentioned above.

For example, in the non-light-emitting stage S4 of each row of sub-pixels, the input of the transmission control signal VT is stopped, the voltage transmitting circuit 120 is turned off, so that the first power voltage VDD cannot be applied to the first terminal 112 of the driving circuit 110, and the light-emitting elements L of the each row of sub-pixels stop emitting light. For example, specific details can be referred to the related description of the non-light-emitting stage S4 in the driving method of the pixel circuit mentioned above, and will not be repeated here.

The driving method of the display substrate shown in FIG. 13 can realize a progressive black insertion during the display time period of one frame, thereby effectively controlling an overall screen brightness when the display substrate is displaying.

FIG. 14 is a signal timing chart of another driving method of a display substrate provided by at least one embodiment of the present disclosure. For example, similar to the signal timing chart shown in FIG. 13, the signal timing chart shown in FIG. 14 can also be used to drive all rows of sub-pixels in the display substrate.

For example, as shown in FIG. 14, the signal timing sequences corresponding to each row of sub-pixels (that is, the timing sequences of the reset control signal RS, the scan signal SN, the transmission control signal VT and the light-emitting control signal EM included in a brace) are basically the same as the signal timing sequences shown in FIG. 6, that is, the operation principle of each row of sub-pixels can be referred to the related description of the foregoing driving method, which will not be repeated here.

For example, similar to the driving method of the display substrate shown in FIG. 13, the driving method of the display substrate shown in FIG. 14 can also include: during a display time period of one frame, causing all rows of sub-pixels to progressively enter a reset stage, a data writing stage and a light-emitting stage. For example, in the driving method of the display substrate shown in FIG. 14, the operation principles of the reset stage, the data writing stage, and the light-emitting stage of each row of sub-pixels can be referred to the operation principles of the reset stage, the data writing stage and the light-emitting stage in the driving method of the display substrate shown in FIG. 13, which will not be repeated here.

For example, as shown in FIG. 14, the driving method of the display substrate can further include: during the display time period of one frame, causing all rows of sub-pixels to simultaneously enter a non-light-emitting stage. For example, as shown in FIG. 14, the light-emitting elements of all rows of sub-pixels can enter the non-light-emitting stage S4 form the light-emitting stage simultaneously by stopping the input of the transmission control signal VT. The embodiments of the present disclosure include but are not limited to such a method of realizing the switching between the light-emitting stage and the non-light-emitting stage, and for example, other methods can be referred to the related descriptions in the driving method of the pixel circuit mentioned above.

For example, in the non-light-emitting stage S4 of all rows of sub-pixels, the input of the transmission control signals VT for all rows of sub-pixels is stopped simultaneously, the voltage transmitting circuits 120 are turned off, so that the first power voltage VDD cannot be applied to the first terminals 112 of the driving circuits 110, to stop the light-emitting elements L of all rows of sub-pixels from emitting light, simultaneously. For example, specific details can be referred to the related description of the driving method of the pixel circuit mentioned above, and will not be repeated here.

The driving method of the display substrate shown in FIG. 14 can realize a full screen black insertion during the display time period of one frame, thereby alleviating a problem of motion blur during display of a high frame rate.

It should be noted that the signal timing charts shown in FIGS. 13 and 14 are illustrative. For the display substrate provided by the embodiments of the present disclosure, the signal timing sequences during operation can be determined according to actual needs, without being limited in the embodiments of the present disclosure.

Figure 15:
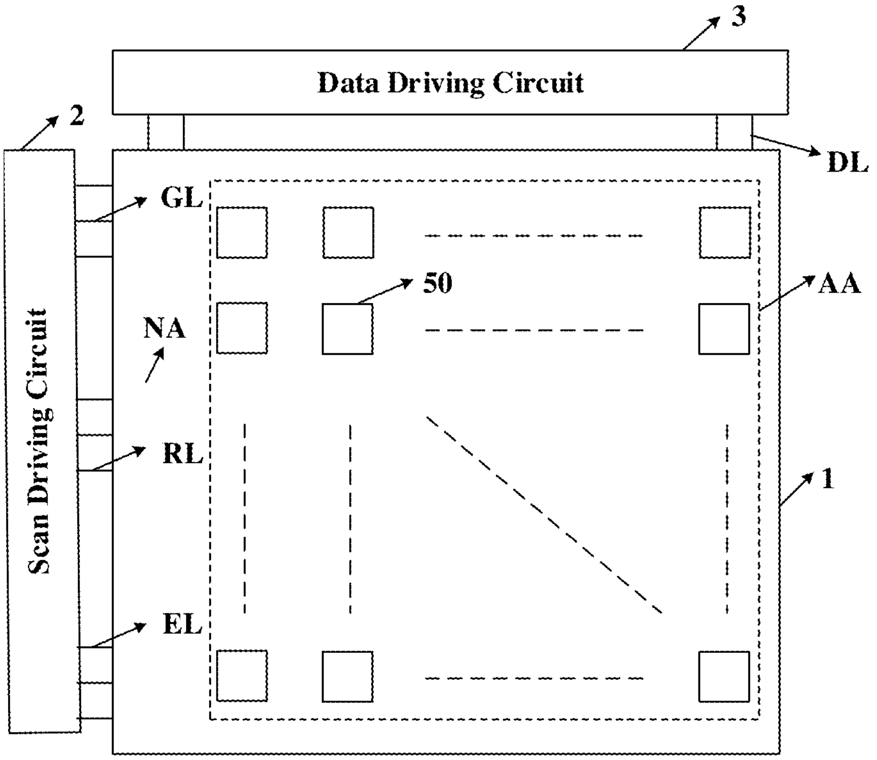
FIG. 15 is a schematic diagram of a display apparatus provided by at least one embodiment of the present disclosure.

At least one embodiment of the present disclosure further provides a display apparatus. FIG. 15 is a schematic diagram of a display apparatus provided by at least one embodiment of the present disclosure. As shown in FIG. 15, the display apparatus can include the display substrate (e.g., the display substrate shown in FIG. 12) provided by any one of the above embodiments of the present disclosure. For example, the display substrate 1 includes a display region AA and a non-display region NA. For example, the display region AA includes a plurality of sub-pixels 50 arranged in an array, and for example, each sub-pixel includes a light-emitting element and a pixel circuit coupled to the light-emitting element (not shown in FIG. 15, referring to FIG. 15); for example, the non-display region NA includes a plurality of voltage control circuits (not shown in FIG. 15, referring to FIG. 15), and each voltage control circuit is coupled to the pixel circuits in at least one row of sub-pixels. For example, the light-emitting element can include one selected from the group consisting of an organic light-emitting diode, a quantum dot light-emitting diode and an inorganic light-emitting diode. For example, the display apparatus can further include a scan driving circuit 2 and a data driving circuit 3.

For example, the scan driving circuit 2 can be connected to the data writing circuits in respective rows of sub-pixels through a plurality of scan signal lines GL, so as to provide scan signals SN; the scan driving circuit 2 can further be connected to a plurality of voltage control circuits through a plurality of reset control signal lines RL and a plurality of light-emitting control signal lines EL, so to provide reset control signals RS and the light-emitting control signals EM. For example, the scan driving circuit can be directly integrated on a display substrate (for example, a silicon-based base substrate) to form a gate driver on array (GOA). Of course, the scan driving circuit can also be implemented as an integrated circuit driver chip which is bonded to the display substrate.

For example, the data driving circuit 3 can be connected to the data writing circuits in each column of sub-pixels through a plurality of data signal lines DL, so as to provide data signals DATA. For example, the data driving circuit 3 can be implemented as an integrated circuit driver chip which is bonded to the display substrate.

For example, the display apparatus can further include other components, such as a timing controller, a signal decoding circuit, a voltage conversion circuit, etc., and these components can adopt conventional components or structures, and details will not be repeated here.

For example, referring to the signal timing chart shown in FIG. 13 or FIG. 14, a progressive scanning process of the display apparatus can be implemented. Respective stages of the pixel circuits in each row can be referred to the related description of the embodiment shown in FIG. 12 or FIG. 13. It should be noted that, in the progressive scanning process, the control signals such as the reset control signal, the scanning signal, the transmission control signal and the light-emitting control signal are all progressively applied according to the timing signal sequences.

For example, the display apparatus in the present embodiment can be any one product or component having a display function, such as a display panel, a display, a television, an electronic paper display apparatus, a mobile phone, a tablet computer, a notebook computer, a digital photo frame, a navigator, a virtual reality device, an augmented reality device, etc. It should be noted that the display apparatus can further include other conventional components or structures. For example, in order to achieve the necessary functions of the display apparatus, those skilled in the art can set other conventional components or structures according to specific application scenarios, without being limited in the embodiments of the present disclosure.

Technical effects of the display apparatus provided by at least one embodiment of the present disclosure can be referred to the related description of the display substrate in the foregoing embodiments, which will not be repeated here.

For the disclosure, the following statements should be noted:

(1) The accompanying drawings related to the embodiment(s) of the present disclosure involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale.

(3) In case of no conflict, the embodiments of the present disclosure and the features in the embodiments can be combined with each other to obtain new embodiments.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A pixel circuit, comprising a pixel sub-circuit and a voltage control circuit, wherein the pixel sub-circuit comprises a driving circuit, a voltage transmitting circuit, and a data writing circuit;

the driving circuit comprises a control terminal, a first terminal and a second terminal;

the voltage transmitting circuit is configured, in response to a transmission control signal, to apply a reset voltage and/or a first power voltage to the first terminal of the driving circuit, respectively;

the data writing circuit is configured, in response to a scan signal, to write a data signal into the control terminal of the driving circuit and store the data signal being written;

the driving circuit is configured to control a voltage of the second terminal of the driving circuit according to the data signal of the control terminal of the driving circuit and the voltage of the first terminal of the driving circuit, and to generate a driving current for driving a light-emitting element to emit light based on the voltage of the second terminal of the driving circuit;

the voltage control circuit is configured to provide the reset voltage to the voltage transmitting circuit in response to a reset control signal, and to provide the first power voltage to the voltage transmitting circuit in response to a light-emitting control signal;

the data writing circuit comprises two switching transistors of different types; and the voltage control circuit is disposed in a non-display region of a display substrate, and the pixel sub-circuit is disposed in a sub-pixel in a display region of the display substrate;

wherein a display grayscale of the light-emitting element is controlled by adjusting a magnitude of the data signal and a time duration of the transmission control signal in a light-emitting stage;

wherein the voltage control circuit comprises a first control sub-circuit and a second control sub-circuit;

the first control sub-circuit is configured to provide the reset voltage to the voltage transmitting circuit in response to the reset control signal; and the second control sub-circuit is configured to provide the first power voltage to the voltage transmitting circuit in response to the light-emitting control signal, wherein the first control sub-circuit comprises a first switching transistor, the second control sub-circuit comprises a second switching transistor, and the voltage transmitting circuit comprises a third switching transistor;

a gate electrode of the first switching transistor is connected to a reset control signal terminal to receive the reset control signal, a first electrode of the first switching transistor is connected to a reset voltage terminal to receive the reset voltage, and a second electrode of the first switching transistor is connected to a first node;

a gate electrode of the second switching transistor is connected to a light-emitting control signal terminal to receive the light-emitting control signal, a first electrode of the second switching transistor is connected to a first power terminal to receive the first power voltage, and a second electrode of the second switching transistor is connected to the first node, a gate electrode of the third switching transistor is connected to a transmission control signal terminal to receive the transmission control signal, a first electrode of the third switching transistor is connected to the first node, and a second electrode of the third switching transistor is connected to a second node;

wherein the second switching transistor and the third switching transistor are of opposite types, and the second switching transistor and the third switching transistor are simultaneously turned off in a data writing stage;

in a case where a target display grayscale of the light-emitting element is less than a preset value, the magnitude of the data signal is kept unchanged, and the time duration of the transmission control signal is adjusted at the light-emitting stage to cause the display grayscale of the light-emitting element to conform to the target display grayscale; and in a case where the target display grayscale of the light-emitting element is not less than the preset value, the time duration of the transmission control signal at the light-emitting stage is kept unchanged, and the magnitude of the data signal is adjusted to cause the display grayscale of the light-emitting element to conform to the target display grayscale.

2. The pixel circuit according to claim 1, wherein the driving circuit comprises a driving transistor, the two switching transistors of different types in the data writing circuit comprise a fourth switching transistor and a fifth switching transistor, and the data writing circuit further comprises a storage capacitor;

a gate electrode of the driving transistor serves as the control terminal of the driving circuit and is connected to a fourth node, a first electrode of the driving transistor serves as the first terminal of the driving circuit and is connected to the second node, and a second electrode of the driving transistor serves as the second terminal of the driving circuit and is connected to a third node;

a gate electrode of the fourth switching transistor is connected to a scan signal terminal to receive the scan signal, a first electrode of the fourth switching transistor is connected to a data signal terminal to receive the data signal, and a second electrode of the fourth switching transistor is connected to the fourth node;

a gate electrode of the fifth switching transistor is configured to receive an inverted signal of the scan signal, a first electrode of the fifth switching electrode is connected to the data signal terminal to receive the data signal, and a second electrode of the fifth switching transistor is connected to the fourth node; and a first terminal of the storage capacitor is connected to the fourth node, and a second terminal of the storage capacitor is connected to a first voltage.

3. The pixel circuit according to claim 2, wherein a first electrode of the light-emitting element is coupled to the third node, and a second electrode of the light-emitting element is connected to a second power terminal to receive a second power voltage.

4. The pixel circuit according to claim 2, wherein the pixel sub-circuit further comprises a current transmitting circuit, and the current transmitting circuit is configured to transmit the driving current generated by the driving circuit to the light-emitting element.

5. The pixel circuit according to claim 4, wherein the current transmitting circuit comprises a sixth switching transistor;

a gate electrode of the sixth switching transistor is connected to a second voltage terminal to receive a second voltage, a first electrode of the sixth switching transistor is connected to the third node, a second electrode of the sixth switching transistor is coupled to a first electrode of the light-emitting element, and a second electrode of the light-emitting element is connected to a second power terminal to receive a second power voltage; and the sixth switching transistor is substantially kept in an on state under control of the second voltage.

6. A driving method of the pixel circuit according to claim 1, comprising: a reset stage, the data writing stage and a light-emitting stage, wherein in the reset stage, input the reset control signal and the transmission control signal to turn on the voltage control circuit and the voltage transmitting circuit, and apply the reset voltage to the first terminal of the driving circuit through the voltage control circuit and the voltage transmitting circuit, so as to reset the light-emitting element;

in the data writing stage, input the scan signal to turn on the data writing circuit, write the data signal into the control terminal of the driving circuit through the date writing circuit, and store, by the data writing circuit, the data signal being written; and in the light-emitting stage, input the light-emitting control signal and the transmission control signal to turn on the voltage control circuit, the voltage transmitting circuit and the driving circuit, and apply the first power voltage to the first terminal of the driving circuit through the voltage control circuit and the voltage transmitting circuit, so that the driving circuit controls the voltage of the second terminal of the driving circuit according to the data signal of the control terminal of the driving circuit and the first power voltage of the first terminal of the driving circuit, and generates the driving current for driving the light-emitting element to emit light based on the voltage of the second terminal of the driving circuit;

in a case where the target display grayscale of the light-emitting element is less than the preset value, keeping the magnitude of the data signal unchanged, and adjusting the time duration of the transmission control signal at the light-emitting stage to cause the display grayscale of the light-emitting element to conform to the target display grayscale; and in a case where the target display grayscale of the light-emitting element is not less than the preset value, keeping the time duration of the transmission control signal at the light-emitting stage unchanged, and adjusting the magnitude of the data signal to cause the display grayscale of the light-emitting element to conform to the target display grayscale.

7. The driving method according to claim 6, wherein after the light-emitting stage, the driving method further comprises a non-light-emitting stage; and in the non-light-emitting stage, stop inputting the transmission control signal to turn off the voltage transmitting circuit, so that the first power voltage is unable to be applied to the first terminal of the driving circuit, to stop the light-emitting element from emitting light.

8. The pixel circuit according to claim 1, wherein the voltage transmitting circuit comprises a third switching transistor, the driving circuit comprises a driving transistor, the two switching transistors of different types in the data writing circuit comprise a fourth switching transistor and a fifth switching transistor, and the data writing circuit further comprises a storage capacitor;

a gate electrode of the third switching transistor is connected to a transmission control signal terminal to receive the transmission control signal, a first electrode of the third switching transistor is connected to the first node, and a second electrode of the third switching transistor is connected to a second node;

a gate electrode of the driving transistor serves as the control terminal of the driving circuit and is connected to a fourth node, a first electrode of the driving transistor serves as the first terminal of the driving circuit and is connected to the second node, and a second electrode of the driving transistor serves as the second terminal of the driving circuit and is connected to a third node;

a gate electrode of the fourth switching transistor is connected to a scan signal terminal to receive the scan signal, a first electrode of the fourth switching transistor is connected to a data signal terminal to receive the data signal, and a second electrode of the fourth switching transistor is connected to the fourth node;

a gate electrode of the fifth switching transistor is configured to receive an inverted signal of the scan signal, a first electrode of the fifth switching electrode is connected to the data signal terminal to receive the data signal, and a second electrode of the fifth switching transistor is connected to the fourth node; and a first terminal of the storage capacitor is connected to the fourth node, and a second terminal of the storage capacitor is grounded.

9. The pixel circuit according to claim 1, wherein the second switching transistor is a P-type transistor, and the third switching transistor is a N-type transistor, in a case where the light-emitting control signal is at a low level, the P-type second switching transistor is turned on; and in a case where the light-emitting control signal is at a high level, the P-type second switching transistor is turned off; and in a case where the transmission control signal is at a high level, the N-type third switching transistor is turned on; and in a case where the transmission control signal VT is at a low level, the N-type third switching transistor M3 is turned off.

10. A display substrate, comprising a pixel circuit, wherein the pixel circuit comprises a pixel sub-circuit and a voltage control circuit, and the pixel sub-circuit comprises a driving circuit, a voltage transmitting circuit, and a data writing circuit;

the driving circuit comprises a control terminal, a first terminal and a second terminal;

the voltage transmitting circuit is configured, in response to a transmission control signal, to apply a reset voltage and a first power voltage to the first terminal of the driving circuit, respectively;

the data writing circuit is configured, in response to a scan signal, to write a data signal into the control terminal of the driving circuit and store the data signal being written;

the driving circuit is configured to control a voltage of the second terminal of the driving circuit according to the data signal of the control terminal of the driving circuit and the voltage of the first terminal of the driving circuit, and to generate a driving current for driving a light-emitting element to emit light based on the voltage of the second terminal of the driving circuit;

the voltage control circuit is configured to provide the reset voltage to the voltage transmitting circuit in response to a reset control signal, and to provide the first power voltage to the voltage transmitting circuit in response to a light-emitting control signal;

the data writing circuit comprises two switching transistors of different types;

the display substrate comprises a display region and a non-display region;

the display region comprises a plurality of sub-pixels arranged in an array, and each of the plurality of sub-pixels comprises the light-emitting element and the pixel sub-circuit coupled to the light-emitting element; and the non-display region comprises a plurality of voltage control circuits, and each of the plurality of voltage control circuits is coupled to the pixel sub-circuits in at least one row of sub-pixels;

wherein the voltage control circuit comprises a first control sub-circuit and a second control sub-circuit;

the first control sub-circuit is configured to provide the reset voltage to the voltage transmitting circuit in response to the reset control signal; and the second control sub-circuit is configured to provide the first power voltage to the voltage transmitting circuit in response to the light-emitting control signal, wherein the first control sub-circuit comprises a first switching transistor, the second control sub-circuit comprises a second switching transistor, and the voltage transmitting circuit comprises a third switching transistor;

a gate electrode of the first switching transistor is connected to a reset control signal terminal to receive the reset control signal, a first electrode of the first switching transistor is connected to a reset voltage terminal to receive the reset voltage, and a second electrode of the first switching transistor is connected to a first node;

a gate electrode of the second switching transistor is connected to a light-emitting control signal terminal to receive the light-emitting control signal, a first electrode of the second switching transistor is connected to a first power terminal to receive the first power voltage, and a second electrode of the second switching transistor is connected to the first node, a gate electrode of the third switching transistor is connected to a transmission control signal terminal to receive the transmission control signal, a first electrode of the third switching transistor is connected to the first node, and a second electrode of the third switching transistor is connected to a second node;

wherein the second switching transistor and the third switching transistor are of opposite types, and the second switching transistor and the third switching transistor are simultaneously turned off in a data writing stage;

in a case where a target display grayscale of the light-emitting element is less than a preset value, the magnitude of the data signal is kept unchanged, and the time duration of the transmission control signal is adjusted at the light-emitting stage to cause the display grayscale of the light-emitting element to conform to the target display grayscale; and in a case where the target display grayscale of the light-emitting element is not less than a preset value, the time duration of the transmission control signal at the light-emitting stage is kept unchanged, and the magnitude of the data signal is adjusted to cause the display grayscale of the light-emitting element to conform to the target display grayscale.

11. The display substrate according to claim 10, further comprising: a plurality of voltage transmission lines in one-to-one correspondence with respective rows of sub-pixels;

wherein the pixel sub-circuits in each row of sub-pixels are connected to the voltage control circuit through a voltage transmission line corresponding to the each row of sub-pixels, and the voltage transmission line is configured to transmit the reset voltage and the first power voltage.

12. The display substrate according to claim 10, wherein the display substrate comprises a silicon-based base substrate, the pixel circuit is at least partially formed in the silicon-based base substrate, and the light-emitting element is formed on the pixel circuit.

13. A driving method of the display substrate according to claim 10, comprising:

during a display time period of one frame, causing all rows of sub-pixels to progressively enter a reset stage, a data writing stage and a light-emitting stage; wherein in the reset stage of each row of sub-pixels, input the reset control signal and the transmission control signal to turn on the voltage control circuit and the voltage transmitting circuit, and apply the reset voltage to the first terminal of the driving circuit through the voltage control circuit and the voltage transmitting circuit, so as to reset the light-emitting element;

in the data writing stage of each row of sub-pixels, input the scan signal to turn on the data writing circuit, write the data signal into the control terminal of the driving circuit through the date writing circuit, and store, by the data writing circuit, the data signal being written; and in the light-emitting stage of each row of sub-pixels, input the light-emitting control signal and the transmission control signal to turn on the voltage control circuit, the voltage transmitting circuit and the driving circuit, and apply the first power voltage to the first terminal of the driving circuit through the voltage control circuit and the voltage transmitting circuit, so that the driving circuit controls the voltage of the second terminal of the driving circuit according to the data signal of the control terminal of the driving circuit and the first power voltage of the first terminal of the driving circuit, and generates the driving current for driving the light-emitting element to emit light based on the voltage of the second terminal of the driving circuit.

14. The driving method according to claim 13, further comprising:

during the display time period of one frame, causing all rows of sub-pixels to progressively enter a non-light-emitting stage; wherein in the non-light-emitting stage of each row of sub-pixels, stop inputting the transmission control signal to turn off the voltage transmitting circuit, so that the first power voltage is unable to be applied to the first terminal of the driving circuit, to stop the light-emitting elements of the each row of sub-pixels from emitting light.

15. The driving method according to claim 13, further comprising:

during the display time period of one frame, causing all rows of sub-pixels to simultaneously enter a non-light-emitting stage; wherein in the non-light-emitting stage of all rows of sub-pixels, stop inputting the transmission control signal to turn off the voltage transmitting circuit, so that the first power voltage is unable to be applied to the first terminal of the driving circuit, to stop the light-emitting elements of all rows of sub-pixels from emitting light, simultaneously.

16. A display apparatus, comprising a display substrate, wherein the display substrate comprises a pixel circuit, the pixel circuit comprises a pixel sub-circuit and a voltage control circuit, and the pixel sub-circuit comprises a driving circuit, a voltage transmitting circuit, and a data writing circuit;

the driving circuit comprises a control terminal, a first terminal and a second terminal;

the voltage transmitting circuit is configured, in response to a transmission control signal, to apply a reset voltage and a first power voltage to the first terminal of the driving circuit, respectively;

the data writing circuit is configured, in response to a scan signal, to write a data signal into the control terminal of the driving circuit and store the data signal being written;

the driving circuit is configured to control a voltage of the second terminal of the driving circuit according to the data signal of the control terminal of the driving circuit and the voltage of the first terminal of the driving circuit, and to generate a driving current for driving a light-emitting element to emit light based on the voltage of the second terminal of the driving circuit;

the voltage control circuit is configured to provide the reset voltage to the voltage transmitting circuit in response to a reset control signal, and to provide the first power voltage to the voltage transmitting circuit in response to a light-emitting control signal;

the data writing circuit comprises two switching transistors of different types; and the display substrate comprises a display region and a non-display region, the display region comprises a plurality of sub-pixels arranged in an array, and each of the plurality of sub-pixels comprises the light-emitting element and the pixel sub-circuit coupled to the light-emitting element, and the non-display region comprises a plurality of voltage control circuits, and each of the plurality of voltage control circuits is coupled to the pixel sub-circuits in at least one row of sub-pixels;

wherein the voltage control circuit comprises a first control sub-circuit and a second control sub-circuit;

the first control sub-circuit is configured to provide the reset voltage to the voltage transmitting circuit in response to the reset control signal; and the second control sub-circuit is configured to provide the first power voltage to the voltage transmitting circuit in response to the light-emitting control signal, wherein the first control sub-circuit comprises a first switching transistor, the second control sub-circuit comprises a second switching transistor, and the voltage transmitting circuit comprises a third switching transistor;

a gate electrode of the first switching transistor is connected to a reset control signal terminal to receive the reset control signal, a first electrode of the first switching transistor is connected to a reset voltage terminal to receive the reset voltage, and a second electrode of the first switching transistor is connected to a first node;

a gate electrode of the second switching transistor is connected to a light-emitting control signal terminal to receive the light-emitting control signal, a first electrode of the second switching transistor is connected to a first power terminal to receive the first power voltage, and a second electrode of the second switching transistor is connected to the first node, a gate electrode of the third switching transistor is connected to a transmission control signal terminal to receive the transmission control signal, a first electrode of the third switching transistor is connected to the first node, and a second electrode of the third switching transistor is connected to a second node;

wherein the second switching transistor and the third switching transistor are of opposite types, and the second switching transistor and the third switching transistor are simultaneously turned off in a data writing stage;

in a case where a target display grayscale of the light-emitting element is less than a preset value, the magnitude of the data signal is kept unchanged, and the time duration of the transmission control signal is adjusted at the light-emitting stage to cause the display grayscale of the light-emitting element to conform to the target display grayscale; and in a case where the target display grayscale of the light-emitting element is not less than the preset value, the time duration of the transmission control signal at the light-emitting stage is kept unchanged, and the magnitude of the data signal is adjusted to cause the display grayscale of the light-emitting element to conform to the target display grayscale.

* * * * *